(12) United States Patent
Terashima et al.

(10) Patent No.: US 12,407,302 B2
(45) Date of Patent: Sep. 2, 2025

(54) POWER AMPLIFIER CIRCUIT

(71) Applicant: Murata Manufacturing Co., Ltd., Kyoto (JP)

(72) Inventors: Toshikazu Terashima, Kyoto (JP); Yuri Honda, Kyoto (JP); Takashi Yamada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 724 days.

(21) Appl. No.: 17/650,674

(22) Filed: Feb. 11, 2022

(65) Prior Publication Data

US 2022/0263477 A1 Aug. 18, 2022

(30) Foreign Application Priority Data

Feb. 15, 2021 (JP) ................................ 2021-021652

(51) Int. Cl.
| | |
|---|---|
| *H03F 1/02* | (2006.01) |
| *H03F 1/30* | (2006.01) |
| *H03F 1/56* | (2006.01) |
| *H03F 3/21* | (2006.01) |

(52) U.S. Cl.
CPC ........... *H03F 1/302* (2013.01); *H03F 1/0222* (2013.01); *H03F 1/565* (2013.01); *H03F 3/211* (2013.01); *H03F 2200/451* (2013.01)

(58) Field of Classification Search
CPC ..... H03F 1/02; H03F 1/07; H03F 1/30; H03F 3/20
USPC ............................. 330/295, 124 R, 296, 285
See application file for complete search history.

(56) References Cited

U.S. PATENT DOCUMENTS

| | | | | |
|---|---|---|---|---|
| 5,629,648 A | * | 5/1997 | Pratt ........................ | H03F 3/211 330/296 |
| 6,377,125 B1 | * | 4/2002 | Pavio ....................... | H03F 3/607 330/296 |
| 6,816,015 B2 | * | 11/2004 | Zhang ....................... | H03F 3/68 330/296 |

FOREIGN PATENT DOCUMENTS

JP 4027349 B2 12/2007

* cited by examiner

*Primary Examiner* — Henry Choe
(74) *Attorney, Agent, or Firm* — McDonald Hopkins LLC

(57) ABSTRACT

A power amplifier circuit includes a first transistor having the base coupled to an input terminal, the collector coupled to an output terminal, and the emitter coupled to ground, a first bias circuit coupled to the base of the first transistor via the first resistance element, a second transistor having the base coupled to the input terminal, the collector coupled to the output terminal, and the emitter coupled to ground, a second bias circuit coupled to the base of the second transistor via the second resistance element, and a first impedance circuit having a first end coupled between the base of the first transistor and the input terminal and a second end coupled between the first bias circuit and the first resistance element and being configured to be opened for a direct-current component and to be closed for an alternating-current component.

18 Claims, 13 Drawing Sheets

KNOWN CIRCUIT EXAMPLE

INPUT-OUTPUT CHARACTERISTIC OF KNOWN CIRCUIT

POWER AMPLIFIER CIRCUIT

CROSS REFERENCE TO RELATED APPLICATION

This application claims priority from Japanese Patent Application No. 2021-021652 filed on Feb. 15, 2021. The content of this application is incorporated herein by reference in its entirety.

BACKGROUND OF THE DISCLOSURE

1. Field of the Disclosure

The present disclosure relates to a power amplifier circuit.

2. Description of the Related Art

In some types of power amplifiers, base bias voltage is supplied through a resistance element to a common-emitter bipolar transistor (refer to, for example, Japanese Patent No. 4027349 (Patent Document 1)).

BRIEF SUMMARY OF THE DISCLOSURE

The power amplifier described in Patent Document 1 includes a first impedance circuit and a second impedance circuit. The first impedance circuit has one terminal coupled to a base terminal of a common-emitter bipolar transistor and the other terminal coupled to a signal input terminal. The second impedance circuit has one terminal coupled to the signal input terminal and the other terminal coupled to a base-bias-voltage feeding terminal. At least either the first impedance circuit or the second impedance circuit is opened for direct-current components; both the first impedance circuit and the second impedance circuit are closed for alternating-current components.

Because the first impedance circuit and the second impedance circuit are provided in the transfer path for alternating current signals, increases in voltage drop at the resistance element are suppressed. This reduces gain compression, and as a result, the linearity of the amplification characteristic can be maintained. This means that it is possible to improve the distortion (harmonic wave) characteristic.

Of power amplifiers used in present mobile communication devices such as mobile phones, some types of power amplifiers increase or decrease their output level to different levels in accordance with the distance between the mobile communication device and the base stations. For such power amplifiers, a demand exists for a technology for suppressing the degradation of the distortion characteristic when the output level is increased or decreased to different levels (changed between different levels).

The present disclosure has been made in consideration of the above circumstances, and an object thereof is to provide a power amplifier circuit capable of suppressing the degradation of the distortion characteristic when its output level is changed between different levels.

A power amplifier circuit according to an aspect of the present disclosure includes a first transistor having the base coupled to an input terminal, the collector coupled to an output terminal, and the emitter coupled to ground, a first resistance element, a first bias circuit coupled to the base of the first transistor via the first resistance element and configured to supply a bias to the first transistor, a second transistor having the base coupled to the input terminal, the collector coupled to the output terminal, and the emitter coupled to ground, a second resistance element, a second bias circuit coupled to the base of the second transistor via the second resistance element and configured to supply a bias to the second transistor, and a first impedance circuit having a first end coupled between the base of the first transistor and the input terminal and a second end coupled between the first bias circuit and the first resistance element and being configured to be opened for a direct-current component and to be closed for an alternating-current component.

The present disclosure can provide the power amplifier circuit capable of suppressing the degradation of the distortion characteristic when its output level is changed between different levels.

DETAILED DESCRIPTION OF THE DISCLOSURE

Figure 1:
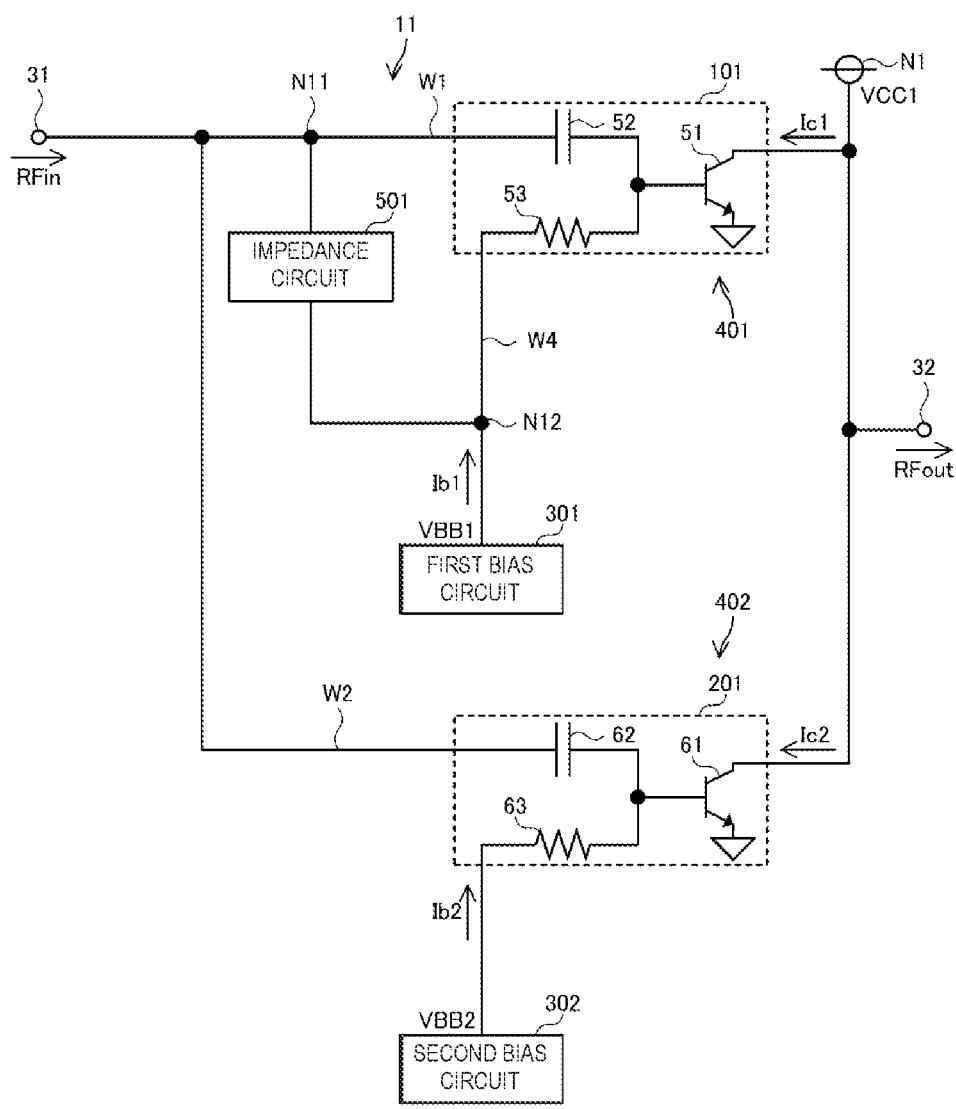
FIG. 1 is a circuit diagram of a power amplifier circuit.

Hereinafter, preferred embodiments of the present disclosure will be described in detail with reference to the drawings. It should be noted that the same elements are assigned with the same reference characters, and redundant descriptions are omitted as much as possible.

First Embodiment

The following describes a power amplifier circuit according to a first embodiment. FIG. 1 is a circuit diagram of a power amplifier circuit 11. As illustrated in FIG. 1, the power amplifier circuit 11 according to the first embodiment is a circuit configured to amplify an input signal (radio-frequency signal) RFin and outputs an output signal (amplified signal) RFout.

The power amplifier circuit 11 includes a bias circuit 301 (first bias circuit), a bias circuit 302 (second bias circuit), amplifiers 401 and 402, and an impedance circuit 501 (first impedance circuit). The amplifier 401 includes a unit transistor 101 (first unit). The unit transistor 101 includes a transistor element 51 (first transistor), a capacitor 52 (impedance circuit), and a resistance element 53 (first resistance element). The amplifier 402 includes the unit transistor 201 (second unit). The unit transistor 201 includes a transistor element 61 (second transistor), a capacitor 62 (impedance circuit), and a resistance element 63 (second resistance element). The elements constituting the power amplifier circuit 11 are formed on the same semiconductor substrate. The elements constituting the power amplifier circuit 11 may be formed on a plurality of semiconductor substrates. The unit transistor denotes a configuration formed by combining together a transistor element, a capacitor, and a resistance element.

In the description of the present embodiment, the elements including the transistor elements 51 and 61 are configured by bipolar transistors such as heterojunction bipolar transistors (HBTs). The transistor elements 51 and 61 may be configured by other kinds of transistors such as metal-oxide-semiconductor field-effect Transistors (MOSFETs). In this case, base, collector, and emitter are respectively regarded as gate, drain, and source.

The transistor element 51 of the amplifier 401 has the base coupled to an input terminal 31 via the capacitor 52, the collector coupled to a supply-voltage feeding node N1 for feeding a supply voltage VCC1 and an output terminal 32, and the emitter coupled to the ground.

The resistance element 53 has a first end coupled to the bias circuit 301 and a second end coupled to the base of the transistor element 51. The capacitor 52 has a first end coupled to the input terminal 31 and a second end coupled to the base of the transistor element 51.

The bias circuit 301 is coupled to the base of the transistor element 51 via the resistance element 53. The bias circuit 301 supplies a bias to the transistor element 51. Details of the bias circuit 301 will be described later.

The transistor element 61 of the amplifier 402 has the base coupled to the input terminal 31 via the capacitor 62, the collector coupled to the supply-voltage feeding node N1 and the output terminal 32, and the emitter coupled to the ground.

The resistance element 63 has a first end coupled to the bias circuit 302 and a second end coupled to the base of the transistor element 61. The capacitor 62 has a first end coupled to a node provided in a wire W1 (first wire) connecting the input terminal 31 and the first end of the capacitor 52, and a second end coupled to the base of the transistor element 61.

The bias circuit 302 is coupled to the base of the transistor element 61 via the resistance element 63. The bias circuit 302 supplies a bias to the transistor element 61. Details of the bias circuit 302 will be described later.

The impedance circuit 501 has a first end coupled between the base of the transistor element 51 and the input terminal 31 and a second end coupled between the bias circuit 301 and the resistance element 53. The impedance circuit 501 is opened for direct-current components and closed for alternating-current components.

In the present embodiment, the first end of the impedance circuit 501 is coupled to a node N11 (first node) provided in the wire W1. The second end of the impedance circuit 501 is coupled to a node N12 provided in a wire W4 connecting the bias circuit 301 and the first end of the resistance element 53.

Figure 2:
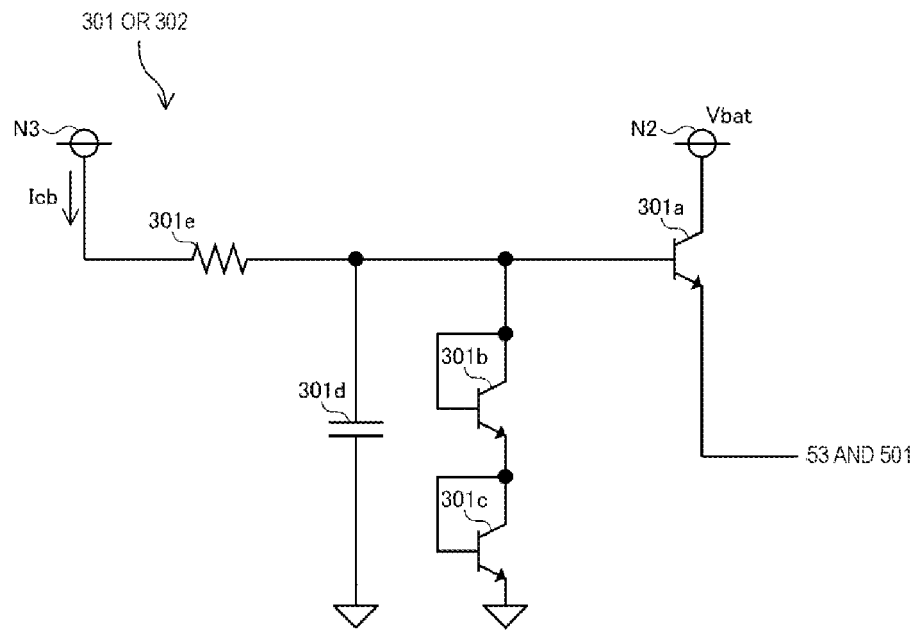
FIG. 2 is a circuit diagram of a bias circuit.

FIG. 2 is a circuit diagram of the bias circuit 301. As illustrated in FIG. 2, the bias circuit 301 includes transistors 301a, 301b, and 301c, a capacitor 301d, and a resistance element 301e. The bias circuit 302 has the same configuration as the bias circuit 301; the bias circuit 301 is described here as the representative, and the description of the bias circuit 302 will be omitted as much as possible. The bias circuit may be configured in any manner other than the manner of the circuit described above.

The bias circuit 301 supplies a bias to the base of the transistor element 51 by using the transistor 301a emitter-follower coupled to the base of the transistor element 51.

Specifically, the transistor 301a has the collector coupled to a battery-voltage feeding node N2 for feeding a battery voltage Vbat, the base, and the emitter coupled to the first end of the resistance element 53 and the second end of the impedance circuit 501.

The transistors 301b and 301c, the capacitor 301d, and the resistance element 301e supply a bias of a predetermined level of voltage to the base of the transistor 301a.

Specifically, the resistance element 301e has a first end coupled to a current feeding node N3 and a second end. Under the control of a bias control circuit (not illustrated in the drawing) in a preceding stage, a control bias current Icb for controlling the amplification of the transistor element 51 or 61 is fed from the current feeding node N3. Details of the control of the bias control circuit will be described later. It should be noted that voltage may be supplied to the current feeding node N3.

The transistor 301b has the collector coupled to the second end of the resistance element 301e and the base of the transistor 301a, the base coupled to the collector, and the emitter. In the following description, the coupling of the collector and base of a transistor may be referred to as diode coupling. The diode-coupled transistor may be replaced with a diode element.

The transistor 301c is formed by diode coupling. The transistor 301c has the collector coupled to the emitter of the transistor 301b and the emitter coupled to the ground. Because both the transistors 301b and 301c function as diodes, a magnitude of voltage drop corresponding to two diodes occurs in a path between the collector and emitter of the transistor 301b and a path between the collector and emitter of the transistor 301c. This means that the voltage at the collector of the transistor 301b is higher by the magnitude of voltage drop corresponding to two diodes than the reference voltage at the ground. This voltage is supplied to the base of the transistor 301a.

The capacitor 301d has a first end coupled to the second end of the resistance element 301e and a second end coupled to the ground. The capacitor 301d stabilizes the voltage at the collector of the transistor 301b.

Power Mode

As illustrated in FIGS. 1 and 2, the power amplifier circuit 11 operates in, for example, two modes of a high-power mode and a low-power mode.

For example, when the power amplifier circuit 11 operates in the high-power mode, the control bias current Icb is supplied from the current feeding node N3 in the bias circuits 301 and 302 under the control of the bias control circuit (not illustrated in the drawing).

At this time, both the transistor elements 51 and 61 provide amplification, and thus, the output signal RFout of relatively high output power is outputted from the output terminal 32.

By contrast, when the power amplifier circuit 11 operates in the low-power mode, under the control of the bias control circuit (not illustrated in the drawing), the control bias current Icb is supplied from the current feeding node N3 in the bias circuit 302, while the control bias current Icb is not supplied from the current feeding node N3 in the bias circuit 301.

At this time, the transistor element 61 provides amplification, but the transistor element 51 does not provide amplification; accordingly, the output signal RFout of relatively low output power is outputted from the output terminal 32.

Effects on Thermal Runaway

Between the bias circuit 301 and the base of the transistor element 51, the impedance circuit 501 is opened for direct-current components. As a result, the direct-current component of a bias current Ib1 flowing from the bias circuit 301 to the base of the transistor element 51 passes through only the resistance element 53.

For example, when the temperature of the transistor element 51 increases under the influence of, for example, amplification operation, the on-voltage of the transistor element 51 lowers, the direct-current component of the bias current Ib1 increases, and a current Ic1 flowing from the collector of the transistor element 51 to the emitter of the transistor element 51 increases. At this time, in response to the increase of the direct-current component of the bias current Ib1, voltage drop across the resistance element 53 also increases. This can consequently lower the electric potential at the base of the transistor element 51 relative to the ground. As a result, it is possible to suppress increases of the direct-current component of the bias current Ib1 and also suppress increases of the current Ic1. Accordingly, it is possible to reduce the likelihood of thermal runaway in the transistor element 51.

Also, in the amplifier 402, voltage drop across the resistance element 63 increases in response to increases in the temperature of the transistor element 61. As a result, it is possible to suppress increases in the direct-current component of a bias current Ib2 flowing from the bias circuit 302 to the base of the transistor element 61 and also suppress increases in a current Ic2 flowing from the collector of the transistor element 61 to the emitter of the transistor element 61. Accordingly, it is possible to reduce the likelihood of thermal runaway in the transistor element 61.

Effects on Gain Compression

Figure 3:
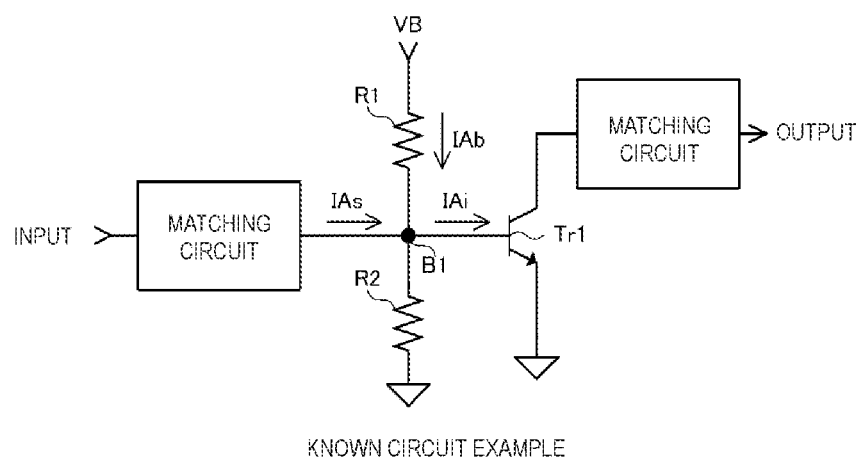
FIG. 3 is a circuit diagram of a high-frequency amplifier circuit of a reference example.
Figure 4:
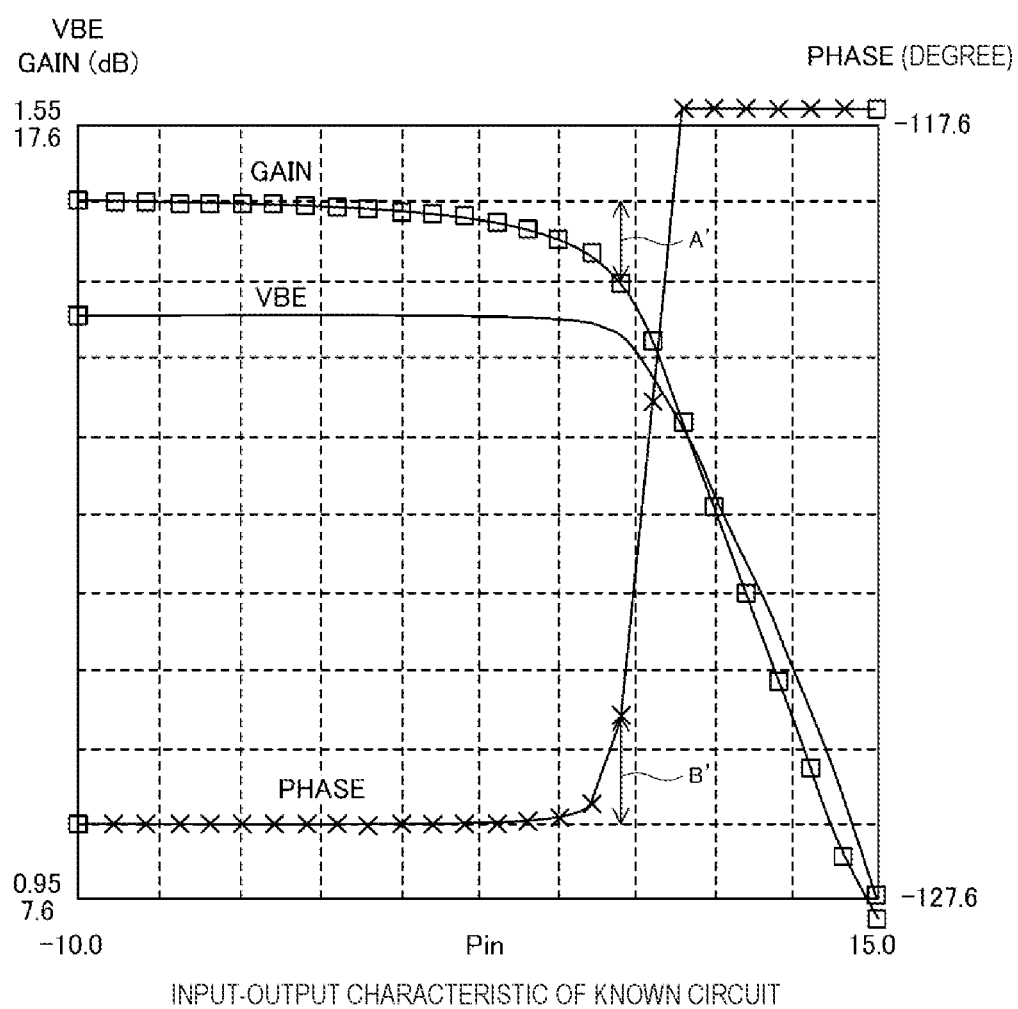
FIG. 4 depicts input-output characteristics of the high-frequency amplifier circuit illustrated in FIG. 3.

FIG. 3 is a circuit diagram of a high-frequency amplifier circuit of a reference example. FIG. 4 depicts input-output characteristics of the high-frequency amplifier circuit illustrated in FIG. 3. The circuit diagram illustrated in FIG. 3 and the input-output characteristics depicted in FIG. 4 are described in, for example, Japanese Unexamined Patent Application Publication No. 9-260964.

As illustrated in FIGS. 3 and 4, a base-emitter direct-current voltage VBE lowers as an input-signal power Pin increases. The base-emitter direct-current voltage VBE corresponds to the electric potential at the base of a bipolar transistor Tr1.

The direct current flowing from the base of the bipolar transistor Tr1 to the emitter of the bipolar transistor Tr1 flows from the base-bias-voltage feeding terminal VB for the bipolar transistor Tr1 via a resistance element R1, the base of the bipolar transistor Tr1, and the emitter of the bipolar transistor Tr1, to the ground.

As described above, the base-emitter direct-current voltage VBE lowers as the input-signal power Pin increases; and accordingly, the electric potential at the base of the bipolar transistor Tr1 lowers as the input-signal power Pin increases. This means that voltage drop across the resistance element R1 increases. This indicates that the base-bias point of the bipolar transistor Tr1a is effectually shifted from class A to class B.

The electric potential at the base of the bipolar transistor Tr1 fluctuates similarly to alternating-current voltage in response to high-frequency input signals, and as a result, alternating current flows between the base-bias-voltage feeding terminal VB and the base of the bipolar transistor Tr1.

When the bias point is shifted to class B, no base current flows for a given period. This hinders the flow of the alternating-current component (hereinafter also referred to as alternating current IAb) of the base current flowing between the base-bias-voltage feeding terminal VB and the base of the bipolar transistor Tr1, and consequently, the alternating current IAb stops increasing in proportion to the input-signal power Pin.

When the alternating current of a high-frequency input signal is IAs, and the alternating current inputted to the base of the bipolar transistor Tr1 is IAi, IAs+IAb≈IAi.

The alternating current IAs increases in proportion to increases in the input-signal power Pin. By contrast, when the input-signal power Pin increases, the alternating current IAb does not increase in proportion to the input-signal power Pin as described above. This means that, when the input-signal power Pin increases, the alternating current IAi does not increase in proportion to the input-signal power Pin, and this results in gain compression in which the output-signal power does not increase in proportion to the input-signal power Pin.

To reduce the gain compression, it is effective to set the resistance of the resistance element R1 to a relatively small value to reduce voltage drop across the resistance element R1. Accordingly, the alternating current IAi increases in proportion to the input-signal power Pin. However, when the resistance of the resistance element R1 is relatively low, the bipolar transistor Tr1 operates in a thermally unstable manner.

By contrast, in the power amplifier circuit 11 illustrated in FIG. 1, the impedance circuit 501 and the capacitor 52 are provided in parallel with the resistance element 53, and thus, the alternating-current component of the bias current Ib1 is caused to flow into the base of the transistor element 51 through the impedance circuit 501 and the capacitor 52. As a result, without lowering the resistance of the resistance element 53, this can achieve the same effect for alternating current as lowering the resistance of the resistance element 53, and consequently, it is possible to reduce the gain compression. As such, the linearity of the amplification characteristic of the transistor element 51 can be maintained, and the distortion characteristic of the power amplifier circuit 11 is improved.

In the description of the power amplifier circuit 11, both the transistor elements 51 and 61 provide amplification in the high-power mode, and only the transistor element 61 provides amplification in the low-power mode. This, however, should not be construed in a limiting sense. For example, when the output power of the transistor element 51 is higher than the output power of the transistor element 61, only the transistor element 51 may provide amplification in the high-power mode, and only the transistor element 61 may provide amplification in the low-power mode. Also, in this case, it is possible to reduce the likelihood of thermal runaway in the transistor elements 51 and 61 and also reduce the gain compression of the transistor element 51 in the high-power mode.

Second Embodiment

The following describes a power amplifier circuit according to a second embodiment. In the second and subsequent embodiments, descriptions of specifics common to the first embodiment are not repeated, and only different points will be explained. In particular, the same effects and advantages achieved by the same configurations are not mentioned in every embodiment.

Figure 5:
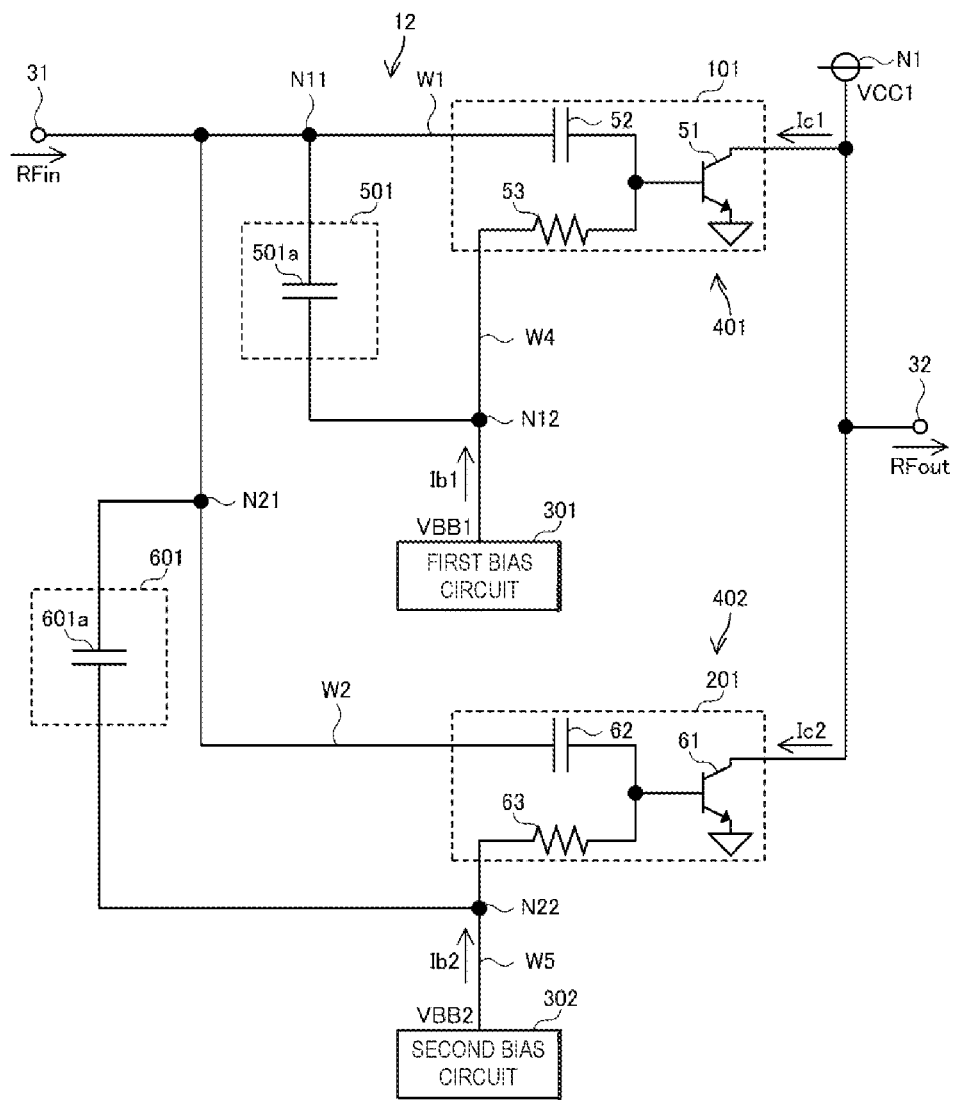
FIG. 5 is a circuit diagram of a power amplifier circuit.

FIG. 5 is a circuit diagram of a power amplifier circuit 12. As illustrated in FIG. 5, the power amplifier circuit 12 according to the second embodiment differs from the power amplifier circuit 11 according to the first embodiment in that the impedance circuit 601 is provided between the bias circuit 302 and the input terminal 31.

When compared to the power amplifier circuit 11 illustrated in FIG. 1, the power amplifier circuit 12 further includes the impedance circuit 601 (second impedance circuit).

The impedance circuit 601 has a first end coupled between the input terminal 31 and the base of the transistor element 61 and a second end coupled between the bias circuit 302 and the resistance element 63. The impedance circuit 601 is opened for direct-current components and closed for alternating-current components.

In the present embodiment, the first end of the impedance circuit 601 is coupled to a node N21 (second node) provided in a wire W2 (second wire) connecting the input terminal 31 and the first end of the capacitor 62. The second end of the impedance circuit 601 is coupled to a node N22 provided in a wire W5 connecting the bias circuit 302 and the first end of the resistance element 63.

The impedance circuit 501 includes a capacitor 501a (first capacitor). Specifically, the capacitor 501a has a first end coupled to the node N11 and a second end coupled to the node N12.

With this configuration, the capacitor 501a can easily implement the impedance circuit 501 configured to be opened for direct-current components and closed for alternating-current components.

The impedance circuit 601 includes a capacitor 601a (second capacitor). Specifically, the capacitor 601a has a first end coupled to the node N21 and a second end coupled to the node N22.

With this configuration, the capacitor 601a can easily implement the impedance circuit 601 configured to be opened for direct-current components and closed for alternating-current components.

Figure 6:
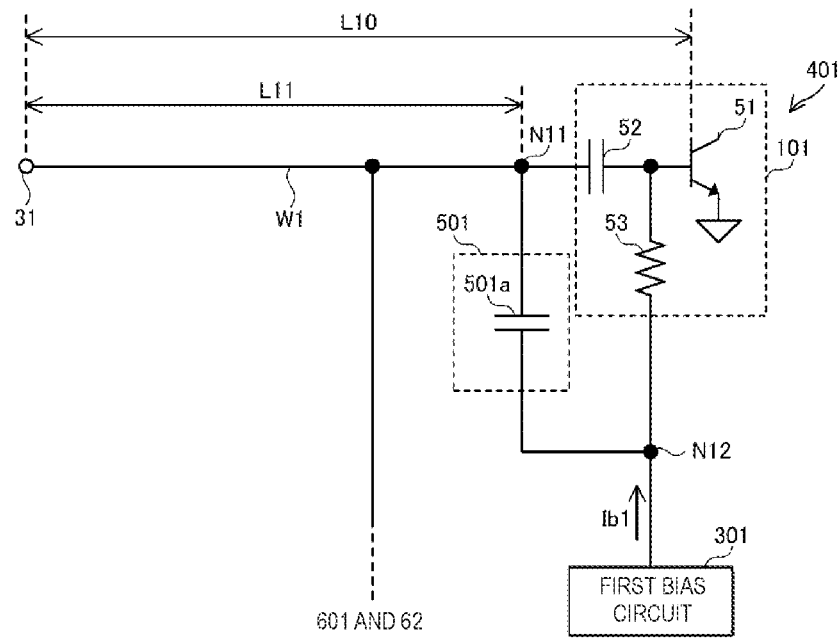
FIG. 6 is a schematic diagram in which a wire of the power amplifier circuit is drawn as a straight line.

FIG. 6 is a schematic diagram in which the wire W1 of the power amplifier circuit 12 is drawn as a straight line. As illustrated in FIG. 6, a length L11 of the wire from the input terminal 31 to the node N11 is more than 0.5 times longer than a length L10 of the wire from the input terminal 31 to the base of the transistor element 51.

With this configuration, the alternating-current component of the bias current Ib1 flowing from the bias circuit 301 to the base of the transistor element 51 can be caused to efficiently flow through the impedance circuit 501 and the capacitor 52 to the base of the transistor element 51. As a result, it is possible to effectively reduce the gain compression of the amplifier 401 and also suppress the degradation of the distortion characteristic of the amplifier 401.

Figure 7:
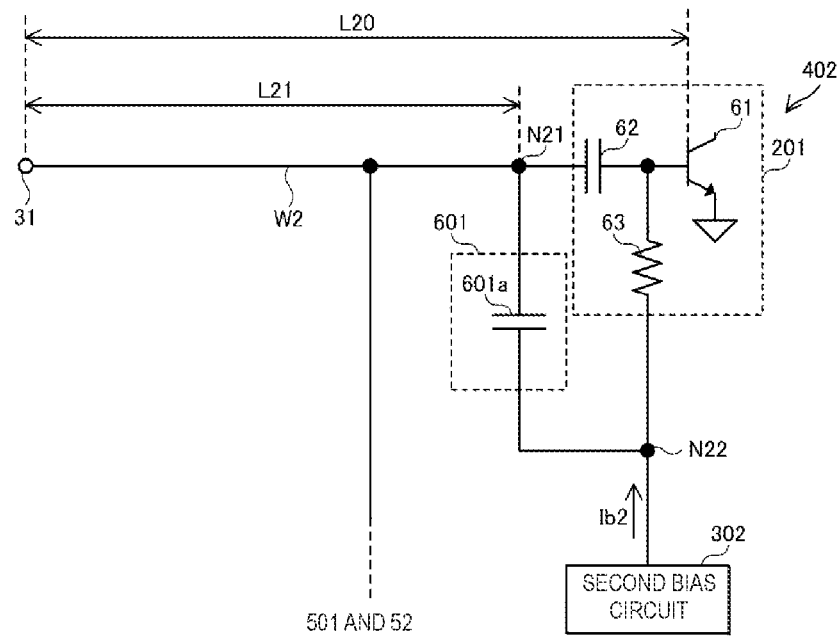
FIG. 7 is a schematic diagram in which a wire of the power amplifier circuit is drawn as a straight line.

FIG. 7 is a schematic diagram in which the wire W2 of the power amplifier circuit 12 is drawn as a straight line. As illustrated in FIG. 7, a length L21 of the wire from the input terminal 31 to the node N21 is more than 0.5 times longer than a length L20 of the wire from the input terminal 31 to the base of the transistor element 61.

With this configuration, the alternating-current component of the bias current Ib2 flowing from the bias circuit 302 to the base of the transistor element 61 can be caused to efficiently flow through the impedance circuit 601 and the capacitor 62 to the base of the transistor element 61. As a result, it is possible to effectively reduce the gain compression of the amplifier 402 and also suppress the degradation of the distortion characteristic of the amplifier 402.

Third Embodiment

Figure 8:
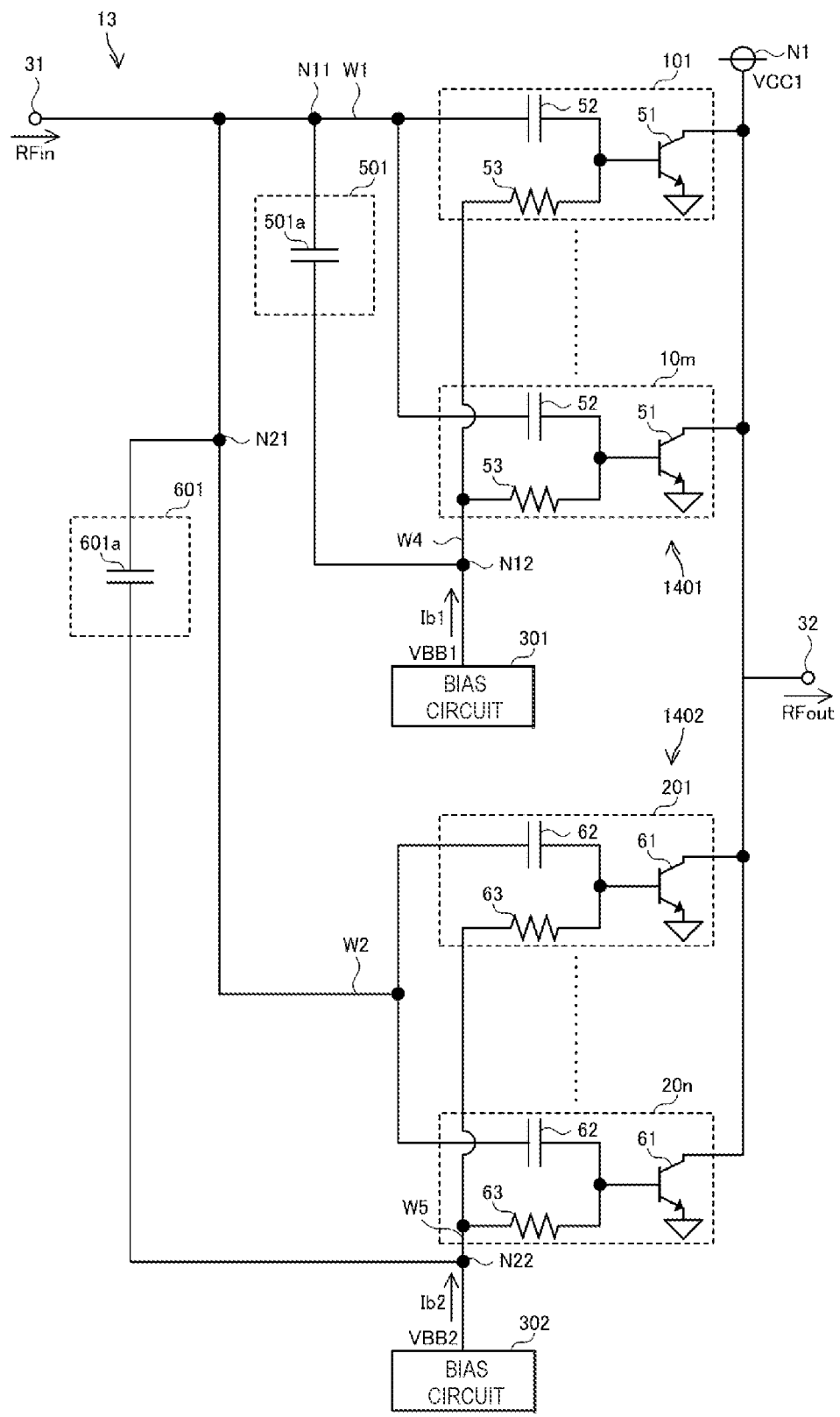
FIG. 8 is a circuit diagram of a power amplifier circuit.

The following describes a power amplifier circuit according to a third embodiment. FIG. 8 is a circuit diagram of the power amplifier circuit 13. As illustrated in FIG. 8, the power amplifier circuit 13 according to the third embodiment differs from the power amplifier circuit 12 according to the second embodiment in that the amplifier 401 includes a plurality of the unit transistors 101, and the amplifier 402 includes a plurality of the unit transistors 201.

When compared to the power amplifier circuit 12 illustrated in FIG. 5, the power amplifier circuit 13 includes the amplifiers 1401 and 1402 instead of the amplifiers 401 and 402. The amplifier 1401 includes a number m of the unit transistors 101, where m is an integer equal to or greater than 2. In FIG. 8, the number m of the unit transistors 101 are uniquely indicated by reference characters 101 to 10m. The unit transistors 101 to 10m each include the transistor element 51, the capacitor 52, and the resistance element 53.

The amplifier 1402 includes a number n of the unit transistors 201, where n is an integer equal to or greater than 2. In FIG. 8, the number n of the unit transistors 201 are uniquely indicated by reference characters 201 to 20n. The unit transistors 201 to 20n each include the transistor element 61, the capacitor 62, and the resistance element 63.

The transistor element 61, the capacitor 62, and the resistance element 63 are almost identical to the transistor element 51, the capacitor 52, and the resistance element 53 with respect to electrical characteristics. This means that the unit transistors 101 to 10m and 201 to 20n have almost the same electrical characteristics.

The number m, which is the count of the unit transistors 101 included in the amplifier 1401, and the number n, which is the count of the unit transistors 201 included in the amplifier 1402, are set as appropriate in accordance with, for example, the output power and output efficiency in the high-power mode and in the low-power mode.

In the present embodiment, the number m and the number n may be, for example, 40 and 20, respectively. In the power amplifier circuit 13, for example, when only the amplifier 1401 provides amplification in the high-power mode, and only the amplifier 1402 provides amplification in the low-power mode, the ratio of the output power in the high-power mode to the output power in the low-power mode is approximately 40:20, that is, approximately 2:1.

In the power amplifier circuit 13, when both the amplifiers 1401 and 1402 provide amplification in the high-power mode, and only the amplifier 1402 provides amplification in the low-power mode, the ratio of the output power in the high-power mode to the output power in the low-power mode is approximately 60:20, that is, approximately 3:1.

The first end of the capacitor 52 of each of the unit transistors 101 to 10m is coupled to the input terminal 31. The first end of the resistance element 53 of each of the unit transistors 101 to 10m is coupled to the second end of the impedance circuit 501, that is, the second end of the capacitor 501a via the node N12 and also coupled to the bias circuit 301 via the node N12. The collector of the transistor element 51 of each of the unit transistors 101 to 10m is coupled to the supply-voltage feeding node N1 and the output terminal 32.

The first end of the capacitor 62 of each of the unit transistors 201 to 20n is coupled to the input terminal 31. The first end of the resistance element 63 of each of the unit transistors 201 to 20*n* is coupled to the second end of the impedance circuit 601, that is, the second end of the capacitor 601*a* via the node N22 and also coupled to the bias circuit 302 via the node N22. The collector of the transistor element 61 of each of the unit transistors 201 to 20*n* is coupled to the supply-voltage feeding node N1 and the output terminal 32.

When the number m of the unit transistors 101 of the amplifier 1401 is greater than the number n of the unit transistors 201 of the amplifier 1402, the capacitance of the capacitor 501*a* is larger than the capacitance of the capacitor 601*a*; when the number m of the unit transistors 101 is equal to or smaller than the number n of the unit transistors 201, the capacitance of the capacitor 501*a* is equal to or smaller than the capacitance of the capacitor 601*a*.

In the present embodiment, the number m of the unit transistors 101 is greater than the number n of the unit transistors 201, and thus, the capacitance of the capacitor 501*a* is larger than the capacitance of the capacitor 601*a*.

The ratio of a capacitance Ca1 of the capacitor 501*a* to a capacitance Ca2 of the capacitor 601*a* is in the range of 0.75 to 1.25 times larger than the ratio of the number m of the unit transistors 101 of the amplifier 1401 to the number n of the unit transistors 201 of the amplifier 1402.

In the present embodiment, Ca1/Ca2 is in the range of 0.75 to 1.25 times larger than m/n, that is, 40/20.

With this configuration, the capacitance of the capacitor 501*a* corresponds to the number m of the unit transistors 101, and the capacitance of the capacitor 601*a* corresponds to the number n of the unit transistors 201. As a result, the alternating-current component of the bias current Ib1 and the alternating-current component of the bias current Ib2 can be set to appropriate values, and thus, it is possible to effectively reduce the gain compression of the transistor elements 51 and 61 and also suppress the degradation of the distortion characteristic of the transistor elements 51 and 61.

Fourth Embodiment

Figure 9:
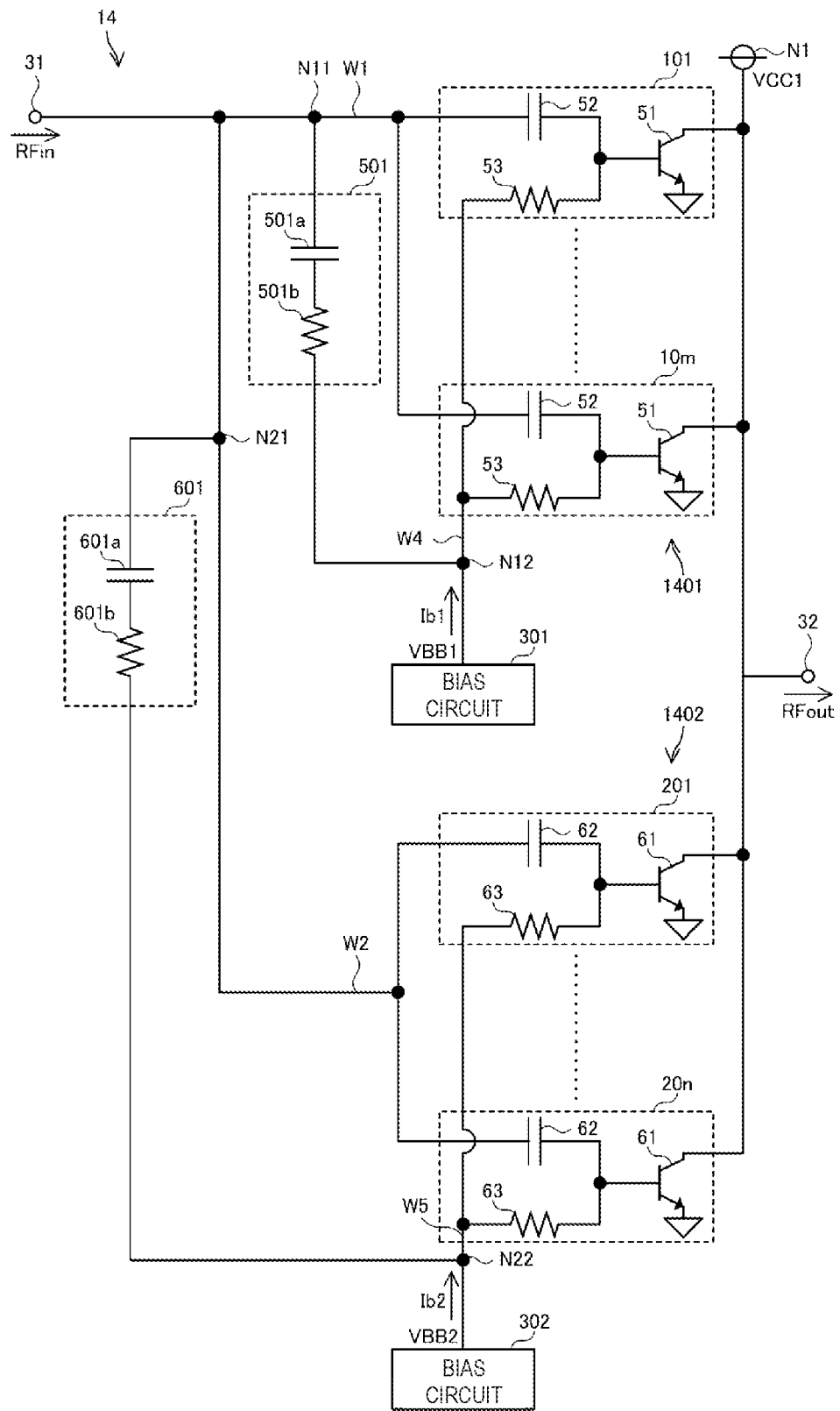
FIG. 9 is a circuit diagram of a power amplifier circuit.

The following describes a power amplifier circuit according to a fourth embodiment. FIG. 9 is a circuit diagram of a power amplifier circuit 14. As illustrated in FIG. 9, the power amplifier circuit 14 according to the fourth embodiment differs from the power amplifier circuit 13 according to the third embodiment in that the impedance circuits 501 and 601 each include a resistance element.

When compared to the impedance circuit 501 of the power amplifier circuit 13 illustrated in FIG. 8, the impedance circuit 501 of the power amplifier circuit 14 further includes a resistance element 501*b* (third resistance element) coupled in series with the capacitor 501*a*.

When compared to the impedance circuit 601 of the power amplifier circuit 13 illustrated in FIG. 8, the impedance circuit 601 of the power amplifier circuit 14 further includes a resistance element 601*b* (fourth resistance element) coupled in series with the capacitor 601*a*.

In the present embodiment, the capacitor 501*a* of the impedance circuit 501 has a first end coupled to the node N11 and a second end. The resistance element 501*b* has a first end coupled to the second end of the capacitor 501*a* and a second end coupled to the node N12.

Of the impedance circuit 501, the first end of the capacitor 501*a* may be coupled to the node N12, and the second end of the resistance element 501*b* may be coupled to the node N11.

As described above, because the resistance element 501*b* is coupled in series with the capacitor 501*a* in the impedance circuit 501, as for the bias current Ib1, it is possible to control the alternating-current component of the bias current flowing to the resistance element 53 of each of the unit transistors 101 to 10*m*. As a result, it is possible to more highly accurately reduce the gain compression than the amplifier 401 of the power amplifier circuit 13 (refer to FIG. 8).

The capacitor 601*a* of the impedance circuit 601 has a first end coupled to the node N21 and a second end. The resistance element 601*b* has a first end coupled to the second end of the capacitor 601*a* and a second end coupled to the node N22.

Of the impedance circuit 601, the first end of the capacitor 601*a* may be coupled to the node N22, and the second end of the resistance element 601*b* may be coupled to the node N21.

As described above, because the resistance element 601*b* is coupled in series with the capacitor 601*a* in the impedance circuit 601, as for the bias current Ib2, it is possible to control the alternating-current component of the bias current flowing to the resistance element 63 of each of the unit transistors 201 to 20*n*. As a result, it is possible to more highly accurately reduce the gain compression than the amplifier 402 of the power amplifier circuit 13 (refer to FIG. 8).

Fifth Embodiment

Figure 10:
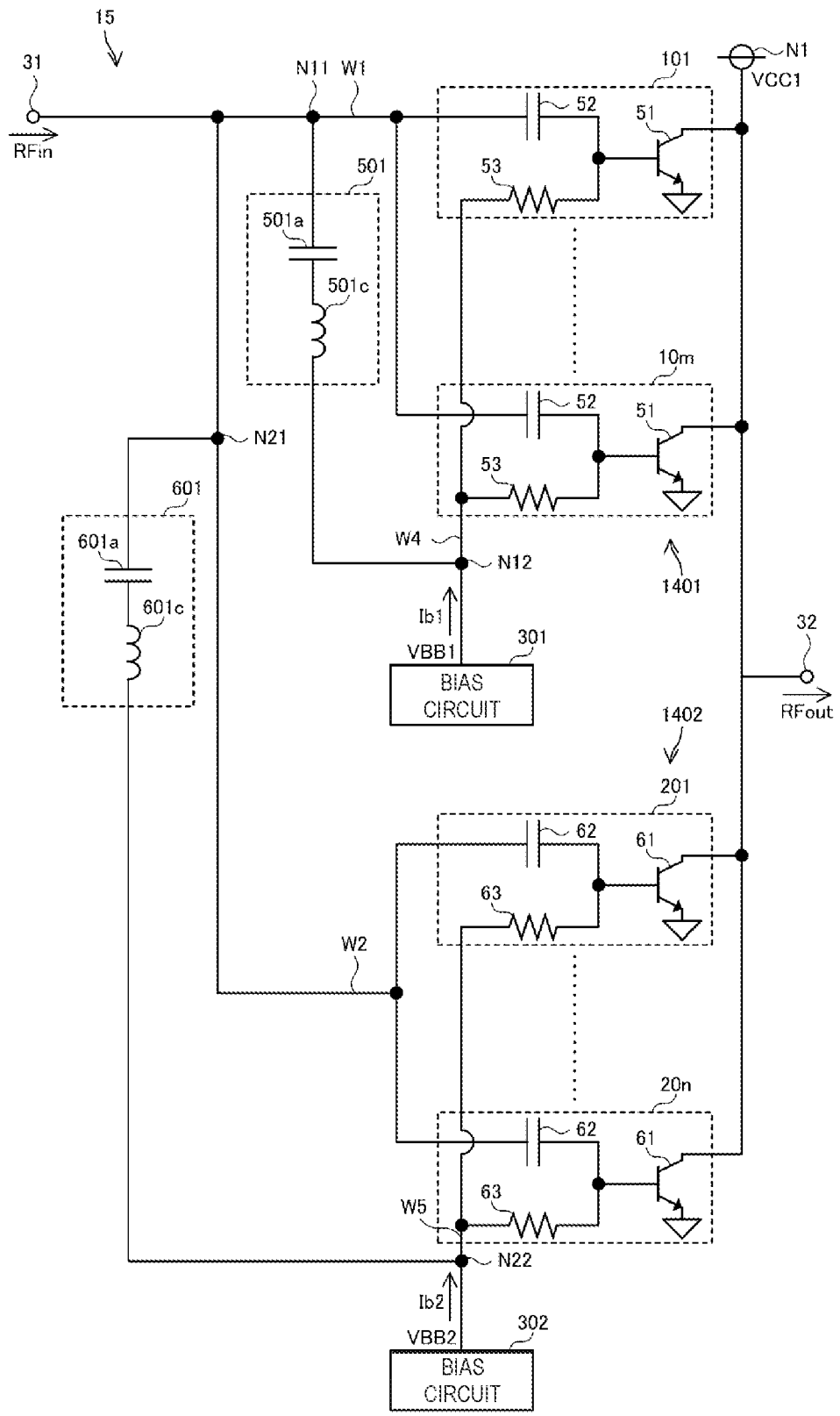
FIG. 10 is a circuit diagram of a power amplifier circuit.

The following describes a power amplifier circuit according to a fifth embodiment. FIG. 10 is a circuit diagram of a power amplifier circuit 15. As illustrated in FIG. 10, the power amplifier circuit 15 according to the fifth embodiment differs from the power amplifier circuit 13 according to the third embodiment in that the impedance circuits 501 and 601 each include an inductor.

When compared to the impedance circuit 501 of the power amplifier circuit 13 illustrated in FIG. 8, the impedance circuit 501 of the power amplifier circuit 15 further includes an inductor 501*c* (first inductor) coupled in series with the capacitor 501*a*.

When compared to the impedance circuit 601 of the power amplifier circuit 13 illustrated in FIG. 8, the impedance circuit 601 of the power amplifier circuit 15 further includes an inductor 601*c* (second inductor) coupled in series with the capacitor 601*a*.

In the present embodiment, the capacitor 501*a* of the impedance circuit 501 has the first end coupled to the node N11 and the second end. The inductor 501*c* has a first end coupled to the second end of the capacitor 501*a* and a second end coupled to the node N12.

Of the impedance circuit 501, the first end of the capacitor 501*a* may be coupled to the node N12, and the second end of the inductor 501*c* may be coupled to the node N11.

As described above, because the inductor 501*c* is coupled in series with the capacitor 501*a* in the impedance circuit 501, as for the bias current Ib1, it is possible to control the alternating-current component of the bias current flowing to the resistance element 53 of each of the unit transistors 101 to 10*m*. Specifically, for example, by appropriately controlling the resonant frequency of a series resonant circuit constituted by the capacitor 501*a* and the inductor 501*c* coupled in series with each other, it is possible to control the alternating-current component of the bias current in response to the frequency of the alternating-current component. As a result, it is possible to more highly accurately reduce the gain compression than the amplifier 401 of the power amplifier circuit 13 (refer to FIG. 8).

The capacitor 601a of the impedance circuit 601 has the first end coupled to the node N21 and the second end. The inductor 601c has a first end coupled to the second end of the capacitor 601a and a second end coupled to the node N22.

Of the impedance circuit 601, the first end of the capacitor 601a may be coupled to the node N22, and the second end of the inductor 601c may be coupled to the node N21.

As described above, because the inductor 601c is coupled in series with the capacitor 601a in the impedance circuit 601, as for the bias current Ib2, it is possible to control the alternating-current component of the bias current flowing to the resistance element 63 of each of the unit transistors 201 to 20n. Specifically, for example, by appropriately controlling the resonant frequency of a series resonant circuit constituted by the capacitor 601a and the inductor 601c coupled in series with each other, it is possible to control the alternating-current component of the bias current in response to the frequency of the alternating-current component. As a result, it is possible to more highly accurately reduce the gain compression than the amplifier 402 of the power amplifier circuit 13 (refer to FIG. 8).

Sixth Embodiment

Figure 11:
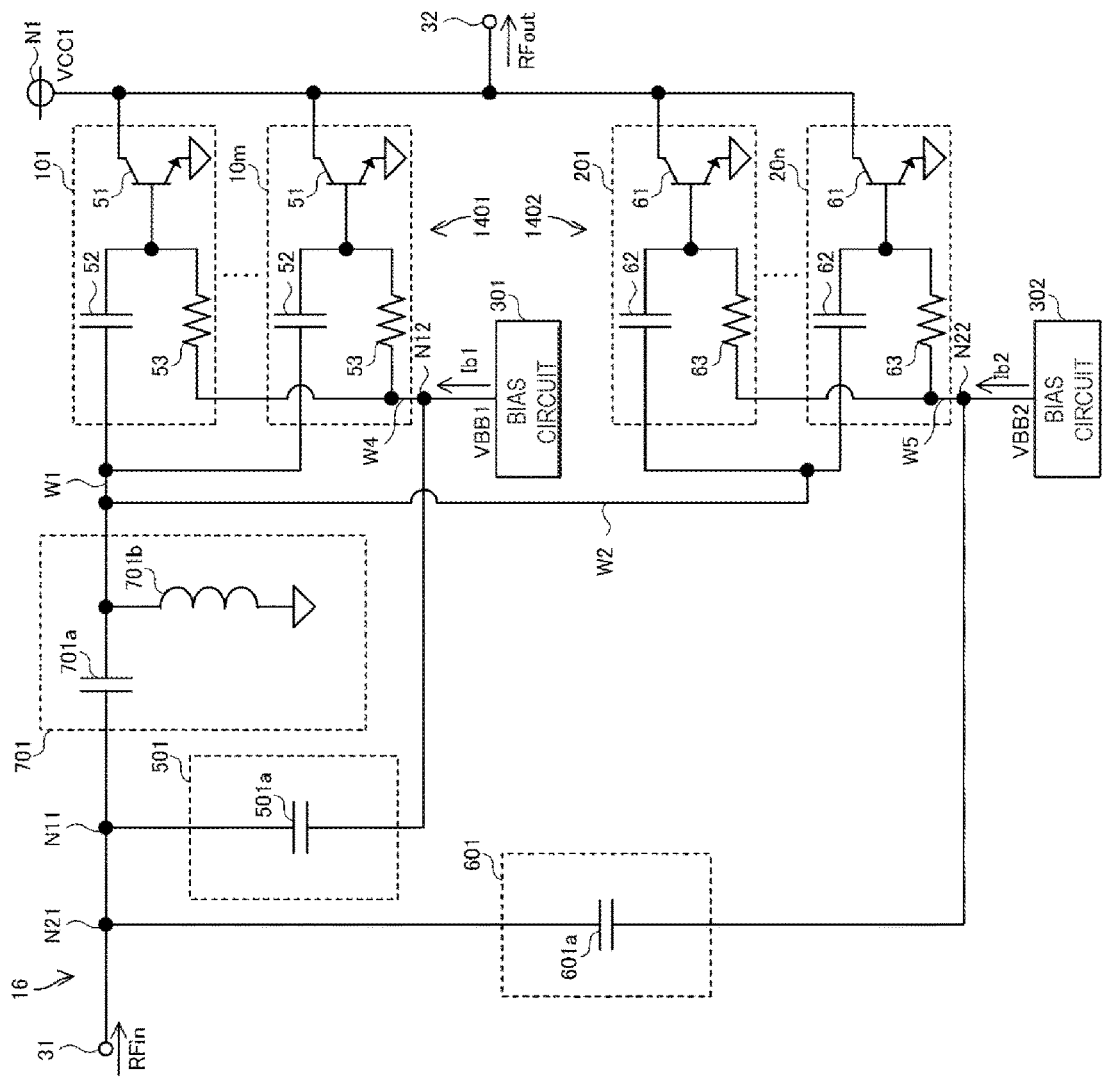
FIG. 11 is a circuit diagram of a power amplifier circuit.

The following describes a power amplifier circuit according to a sixth embodiment. FIG. 11 is a circuit diagram of a power amplifier circuit 16. As illustrated in FIG. 11, the power amplifier circuit 16 according to the sixth embodiment differs from the power amplifier circuit 13 according to the third embodiment in that a matching circuit is provided in a stage before the amplifiers.

When compared to the power amplifier circuit 13 illustrated in FIG. 8, the power amplifier circuit 16 further includes a matching circuit 701 (first matching circuit).

The matching circuit 701 has a first end coupled to the input terminal 31, the first end of the impedance circuit 501, and the first end of the impedance circuit 601 and a second end coupled to the base of the transistor element 51 and the base of the transistor element 61.

In the present embodiment, the matching circuit 701 includes a capacitor 701a and an inductor 701b. The capacitor 701a has a first end coupled to the input terminal 31, the first end of the capacitor 501a, and the first end of the capacitor 601a. The capacitor 701a also has a second end coupled to the first end of the capacitor 52 of each of the unit transistors 101 to 10m and the first end of the capacitor 62 of each of the unit transistors 201 to 20n.

The inductor 701b has a first end coupled to the first end of the capacitor 701a and a second end coupled to the ground.

For example, because the impedance circuits 501 and 601 are provided, an impedance mismatch may be caused between a circuit in a stage before the power amplifier circuit 16 and the amplifiers 1401 and 1402. With consideration of this problem, the matching circuit 701 is provided between the input terminal 31, the first end of the impedance circuit 501, and the first end of the impedance circuit 601, and the amplifiers 1401 and 1402, so that it is possible to improve the impedance mismatch due to the impedance circuits 501 and 601. This configuration can effectively match the impedance between the circuit in a stage before the power amplifier circuit 16 and the amplifiers 1401 and 1402.

Seventh Embodiment

Figure 12:
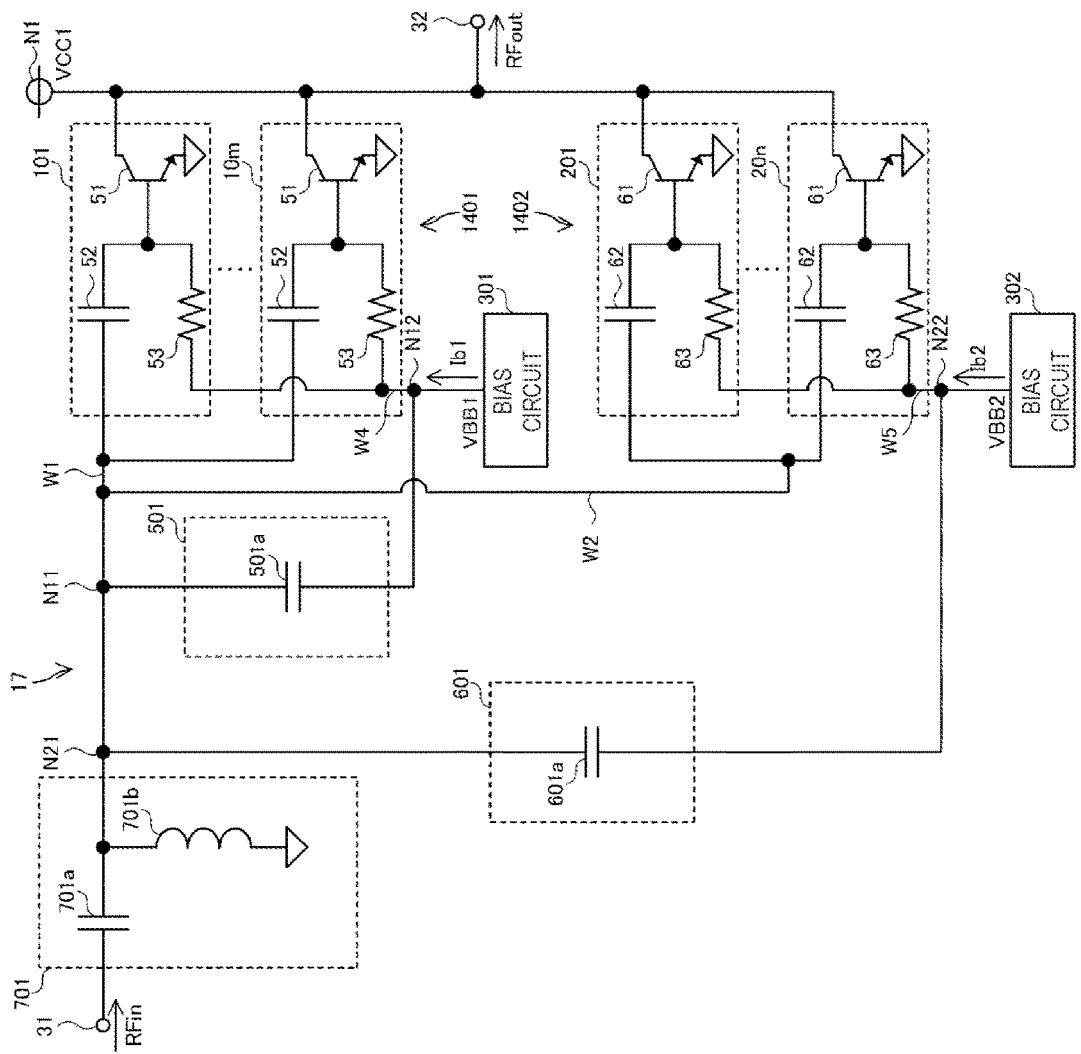
FIG. 12 is a circuit diagram of a power amplifier circuit.

The following describes a power amplifier circuit according to a seventh embodiment. FIG. 12 is a circuit diagram of a power amplifier circuit 17. As illustrated in FIG. 12, the power amplifier circuit 17 according to the seventh embodiment differs from the power amplifier circuit 16 according to the sixth embodiment in that the matching circuit is provided between the input terminal 31, and the first end of the impedance circuit 501 and the first end of the impedance circuit 601.

In the present embodiment, the matching circuit 701 has a first end coupled to the input terminal 31 and a second end coupled to the first end of the impedance circuit 501, the first end of the impedance circuit 601, the base of the transistor element 51, and the base of the transistor element 61.

Specifically, the capacitor 701a of the matching circuit 701 has a first end coupled to the input terminal 31 and a second end coupled to the first end of the capacitor 501a, the first end of the capacitor 601a, the first end of the capacitor 52 of each of the unit transistors 101 to 10m, and the first end of the capacitor 62 of each of the unit transistors 201 to 20n.

The inductor 701b has the first end coupled to the first end of the capacitor 701a and the second end coupled to the ground.

For example, because the impedance circuits 501 and 601 are provided, an impedance mismatch may be caused between a circuit in a stage before the power amplifier circuit 17 and the amplifiers 1401 and 1402. With consideration of this problem, the matching circuit 701 is provided between the input terminal 31, and the first end of the impedance circuit 501, the first end of the impedance circuit 601, and the amplifiers 1401 and 1402, so that it is possible to improve the impedance mismatch due to the impedance circuits 501 and 601. This configuration can effectively match the impedance between the circuit in a stage before the power amplifier circuit 17 and the amplifiers 1401 and 1402.

The capacitance (hereinafter also referred to as second capacitance) of the capacitor 501a is larger than when the impedance circuit 501 is coupled between the input terminal 31 and the matching circuit 701 (hereinafter, the capacitance of the capacitor 501a in this case is also referred to as first capacitance).

In other words, the first capacitance, which is the capacitance of the capacitor 501a of the power amplifier circuit 16 illustrated in FIG. 11, is smaller than the second capacitance, which is the capacitance of the capacitor 501a obtained when the impedance circuit 501 is coupled between the matching circuit 701, and the base of the transistor element 51 and the base of the transistor element 61.

Here, the first capacitance is the capacitance of the capacitor 501a obtained when the power amplifier circuit 16 illustrated in FIG. 11 can effectively achieve impedance matching between the circuit in a stage before the power amplifier circuit 16, and the amplifiers 1401 and 1402 and also effectively reduce the gain compression of the amplifier 1401.

The second capacitance is the capacitance of the capacitor 501a obtained when the power amplifier circuit 17 illustrated in FIG. 12 can effectively achieve impedance matching between the circuit in a stage before the power amplifier circuit 17, and the amplifiers 1401 and 1402 and also effectively reduce the gain compression of the amplifier 1401.

The capacitance (hereinafter also referred to as fourth capacitance) of the capacitor 601a is larger than when the impedance circuit 601 is coupled between the input terminal 31 and the matching circuit 701 (hereinafter, the capacitance of the capacitor 601a in this case is also referred to as third capacitance).

In other words, the third capacitance, which is the capacitance of the capacitor 601a of the power amplifier circuit 16 illustrated in FIG. 11, is smaller than the fourth capacitance, which is the capacitance of the capacitor 601a obtained when the impedance circuit 601 is coupled between the matching circuit 701, and the base of the transistor element 51 and the base of the transistor element 61.

Here, the third capacitance is the capacitance of the capacitor 601a obtained when the power amplifier circuit 16 illustrated in FIG. 11 can effectively achieve impedance matching between the circuit in a stage before the power amplifier circuit 16, and the amplifiers 1401 and 1402 and also effectively reduce the gain compression of the amplifier 1402.

The fourth capacitance is the capacitance of the capacitor 601a obtained when the power amplifier circuit 17 illustrated in FIG. 12 can effectively achieve impedance matching between the circuit in a stage before the power amplifier circuit 17, and the amplifiers 1401 and 1402 and also effectively reduce the gain compression of the amplifier 1402.

Specifically, the second capacitance of the capacitor 501a and the fourth capacitance of the capacitor 601a illustrated in FIG. 12 are respectively larger than the first capacitance of the capacitor 501a and the third capacitance of the capacitor 601a illustrated in FIG. 11.

As such, it is possible to achieve suitable values of the first capacitance and the second capacitance with consideration of the capacitance of the capacitor 701a of the matching circuit 701, and as a result, the alternating-current component of the bias current Ib1 can be caused to adequately flow to the base of the transistor element 51 through the impedance circuit 501. As a result, it is possible to adequately reduce the gain compression of the transistor element 51 and also suppress the degradation of the distortion characteristic of the transistor element 51.

Further, it is possible to achieve suitable values of the third capacitance and the fourth capacitance with consideration of the capacitance of the capacitor 701a of the matching circuit 701, and as a result, the alternating-current component of the bias current Ib2 can be caused to adequately flow to the base of the transistor element 61 through the impedance circuit 601. As a result, it is possible to adequately reduce the gain compression of the transistor element 61 and also suppress the degradation of the distortion characteristic of the transistor element 61.

Eighth Embodiment

Figure 13:
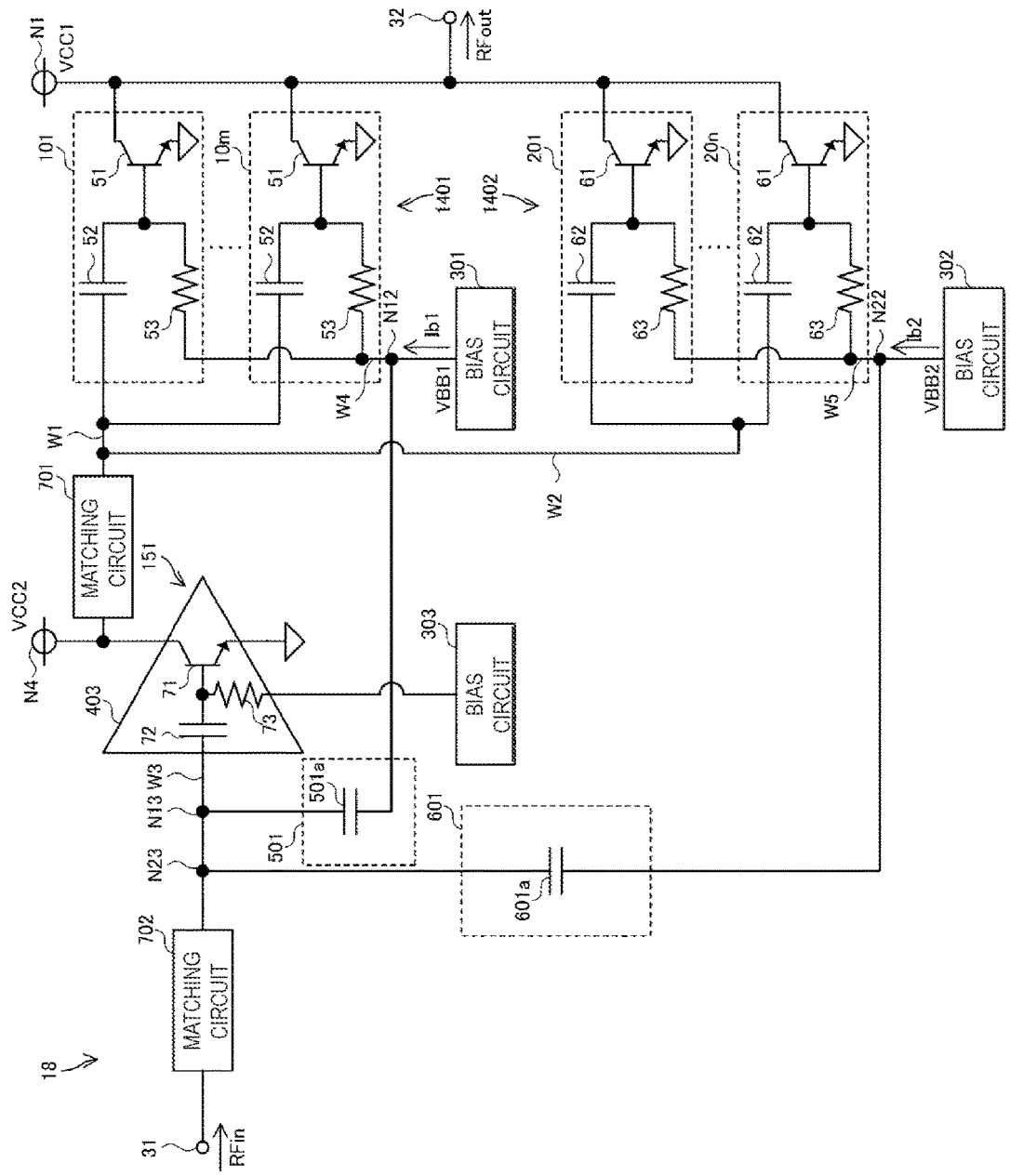
FIG. 13 is a circuit diagram of a power amplifier circuit.

The following describes a power amplifier circuit according to an eighth embodiment. FIG. 13 is a circuit diagram of a power amplifier circuit 18. As illustrated in FIG. 13, the power amplifier circuit 18 according to the eighth embodiment differs from the power amplifier circuit 16 according to the sixth embodiment in that the power amplifier circuit 18 includes amplifiers in two stages.

When compared to the power amplifier circuit 16 illustrated in FIG. 11, the power amplifier circuit 18 further includes a bias circuit 303, an amplifier 403, and a matching circuit 702 (second matching circuit).

The matching circuit 702 is configured in the same manner as, for example, the matching circuit 701. The bias circuit 303 is configured in the same manner as, for example, the bias circuit 301 or 302.

The amplifier 403 includes a unit transistor 151. The amplifier 403 functions as a first-stage amplifier. The unit transistor 151 includes a transistor element 71 (third transistor), a capacitor 72 (impedance circuit), and a resistance element 73.

The capacitor 72 of the amplifier 403 has a first end coupled to the input terminal 31 via the matching circuit 702 and a second end. The transistor element 71 has a base coupled to the second end of the capacitor 72, a collector coupled to a supply-voltage feeding node N4 for feeding a supply voltage VCC2 and also coupled to the amplifiers 1401 and 1402 via the matching circuit 701, and an emitter coupled to the ground. Specifically, the collector of the transistor element 71 is coupled to the base of the transistor element 51 via the matching circuit 701 and the capacitor 52 and also to the base of the transistor element 61 via the matching circuit 701 and the capacitor 62.

The resistance element 73 has a first end coupled to the bias circuit 303 and a second end coupled to the base of the transistor element 71. The bias circuit 303 supplies a bias to the base of the transistor element 71 through the resistance element 73.

The impedance circuit 501 has a first end coupled between the base of the transistor element 71 and the matching circuit 702 and a second end coupled between the bias circuit 301 and the resistance element 53.

Specifically, the capacitor 501a of the impedance circuit 501 has a first end coupled to a node N13 provided in a wire W3 connecting the matching circuit 702 and the first end of the capacitor 72 and a second end coupled to the node N12.

The impedance circuit 601 has a first end coupled between the base of the transistor element 71 and the matching circuit 702 and a second end coupled between the bias circuit 302 and the resistance element 63.

Specifically, the capacitor 601a of the impedance circuit 601 has a first end coupled to a node N23 provided in the wire W3 and a second end coupled to the node N22.

As described above, the impedance circuits 501 and 601 are not coupled between the first-stage amplifier 403 and the final-stage amplifiers 1401 and 1402, and as a result, it is possible to reduce the likelihood of a mismatch of the input of the final-stage amplifiers 1401 and 1402. Consequently, in the power amplifier circuit 18 including amplifiers in two stages, it is possible to suppress the degradation of the distortion characteristic of the final-stage amplifiers 1401 and 1402 due to the impedance circuits 501 and 601.

Ninth Embodiment

Figure 14:
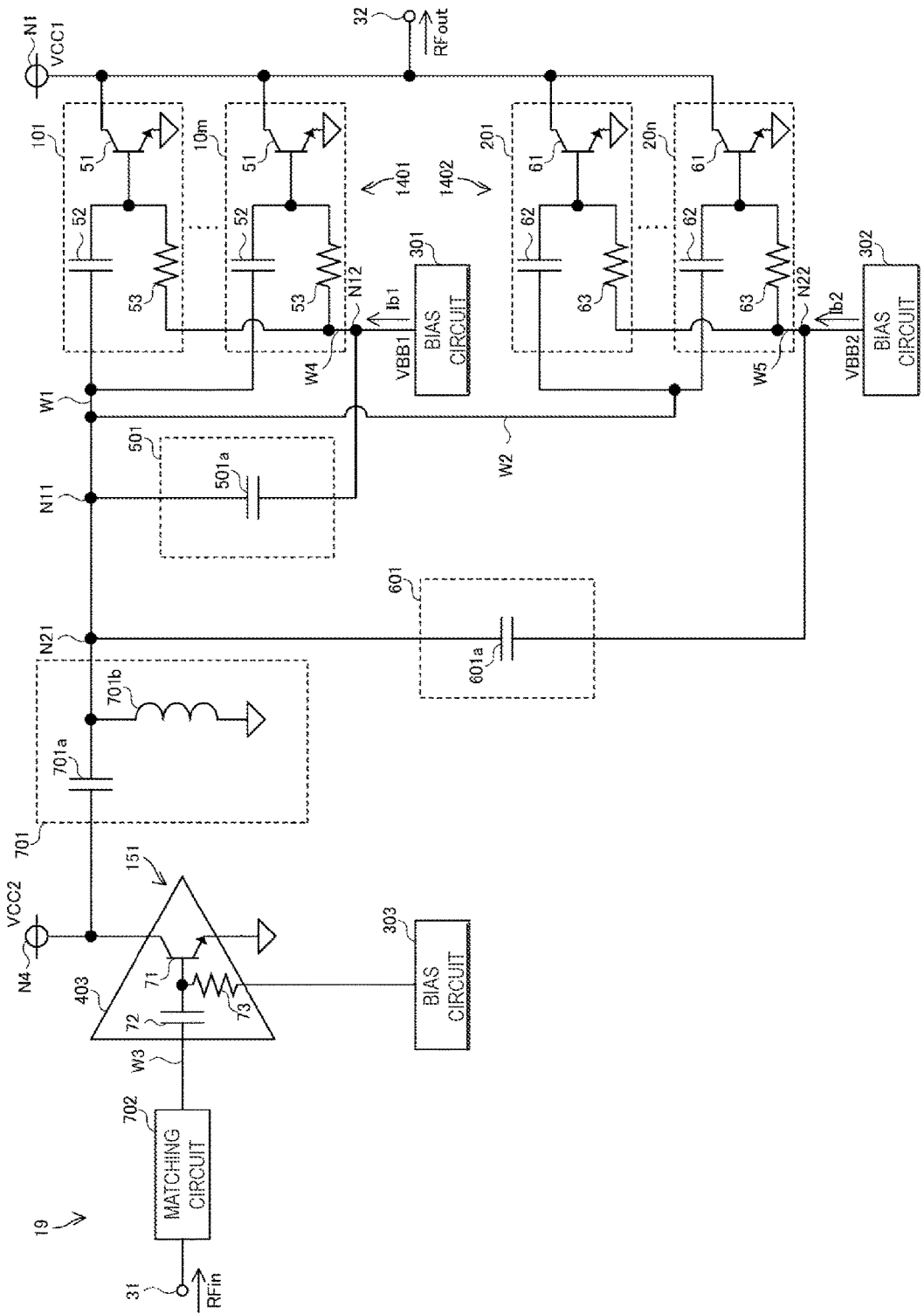
FIG. 14 is a circuit diagram of a power amplifier circuit.

The following describes a power amplifier circuit according to a ninth embodiment. FIG. 14 is a circuit diagram of a power amplifier circuit 19. As illustrated in FIG. 14, the power amplifier circuit 19 according to the ninth embodiment differs from the power amplifier circuit 17 according to the seventh embodiment in that the power amplifier circuit 19 includes amplifiers in two stages.

When compared to the power amplifier circuit 17 illustrated in FIG. 12, the power amplifier circuit 19 further includes the bias circuit 303, the amplifier 403, and the matching circuit 702.

The bias circuit 303, the amplifier 403, and the matching circuit 702 of the power amplifier circuit 19 are configured in the same manner as the bias circuit 303, the amplifier 403, and the matching circuit 702 of the power amplifier circuit 18 illustrated in FIG. 13.

The collector of the transistor element 71 of the amplifier 403 is coupled to the supply-voltage feeding node N4 and also to the first end of the capacitor 52 and the first end of the capacitor 62 via the matching circuit 701.

The first end of the capacitor 501a of the impedance circuit 501 is coupled to the collector of the transistor element 71 via the capacitor 701a of the matching circuit 701. The first end of the capacitor 601a of the impedance circuit 601 is coupled to the collector of the transistor element 71 via the capacitor 701a of the matching circuit 701.

For example, because the impedance circuits 501 and 601 are provided, an impedance mismatch may be caused between the amplifier 403 and the amplifiers 1401 and 1402. With consideration of this problem, the matching circuit 701 is provided between the amplifier 403, and the first end of the impedance circuit 501, the first end of the impedance circuit 601, and the amplifiers 1401 and 1402, so that it is possible to improve the impedance mismatch due to the impedance circuits 501 and 601. This configuration can effectively match the impedance between the amplifier 403 and the amplifiers 1401 and 1402.

In the above description, the first end of the capacitor 501a of the impedance circuit 501 is coupled to the collector of the transistor element 71 via the capacitor 701a of the matching circuit 701, but this should not be construed in a limiting sense. The first end of the capacitor 501a may be coupled directly to the collector of the transistor element 71. This configuration can also effectively match the impedance between the amplifier 403 and the amplifiers 1401 and 1402.

Further, in the above description, the first end of the capacitor 601a of the impedance circuit 601 is coupled to the collector of the transistor element 71 via the capacitor 701a of the matching circuit 701, but this should not be construed in a limiting sense. The first end of the capacitor 601a may be coupled directly to the collector of the transistor element 71. This configuration can also effectively match the impedance between the amplifier 403 and the amplifiers 1401 and 1402.

Tenth Embodiment

Figure 15:
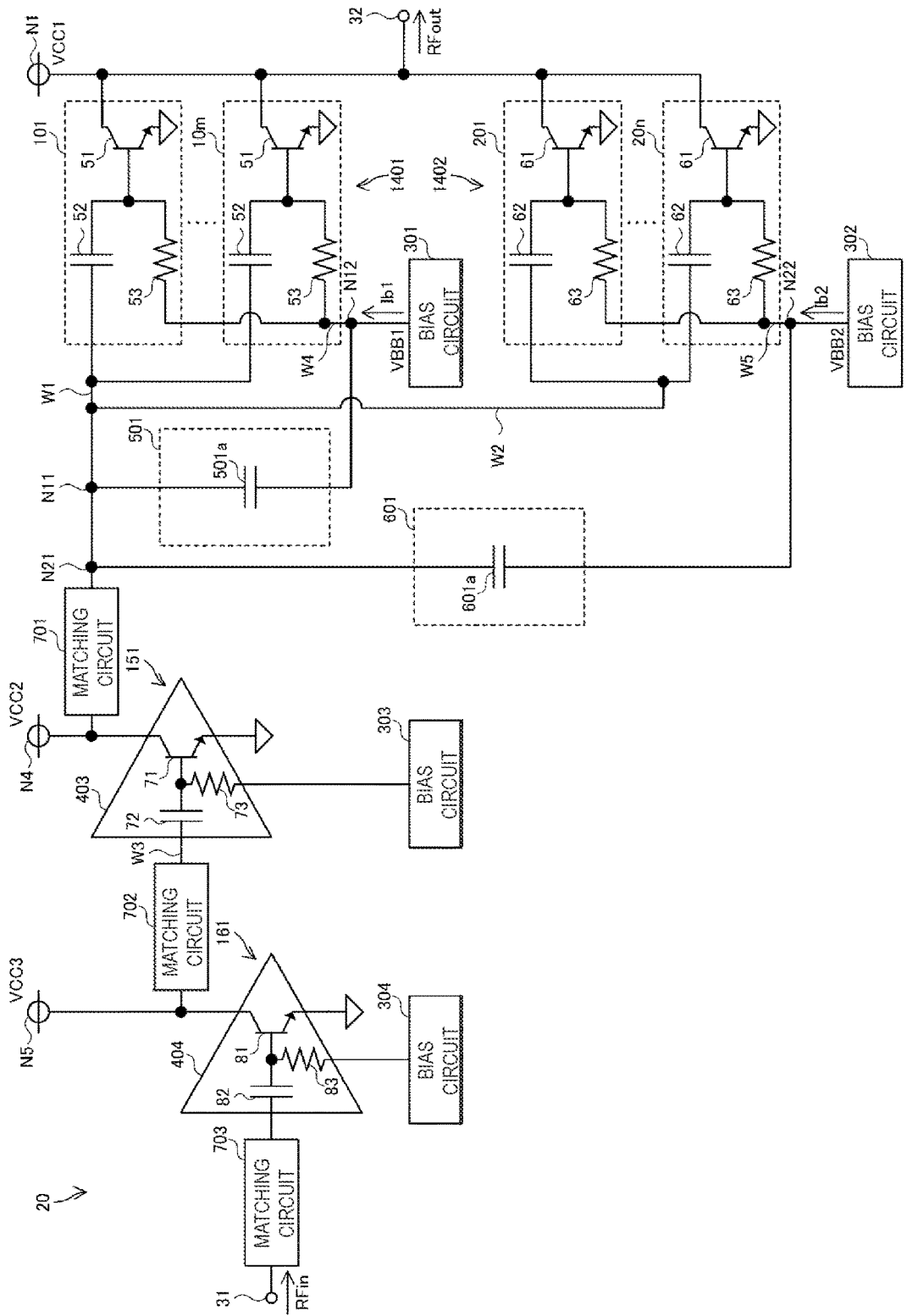
FIG. 15 is a circuit diagram of a power amplifier circuit.

The following describes a power amplifier circuit according to a tenth embodiment. FIG. 15 is a circuit diagram of a power amplifier circuit 20. As illustrated in FIG. 15, the power amplifier circuit 20 according to the tenth embodiment differs from the power amplifier circuit 19 according to the ninth embodiment in that the power amplifier circuit 20 includes amplifiers in three stages.

When compared to the power amplifier circuit 19 illustrated in FIG. 14, the power amplifier circuit 20 further includes a bias circuit 304, an amplifier 404, and a matching circuit 703.

The matching circuit 703 is configured in the same manner as, for example, the matching circuit 701. The bias circuit 304 is configured in the same manner as, for example, the bias circuit 301 or 302.

The amplifier 404 includes a unit transistor 161. The amplifier 404 functions as a first-stage amplifier. The unit transistor 161 includes a transistor element 81, a capacitor 82 (impedance circuit), and a resistance element 83.

The capacitor 82 of the amplifier 404 has a first end coupled to the input terminal 31 via the matching circuit 703 and a second end. The transistor element 81 has a base coupled to the second end of the capacitor 82, a collector coupled to a supply-voltage feeding node N5 for feeding a supply voltage VCC3 and also coupled to the amplifier 403 via the matching circuit 702, and an emitter coupled to the ground. Specifically, the collector of the transistor element 81 is coupled to the base of the transistor element 71 via the matching circuit 702 and the capacitor 72.

The resistance element 83 has a first end coupled to the bias circuit 304 and a second end coupled to the base of the transistor element 81. The bias circuit 304 supplies a bias to the base of the transistor element 81 through the resistance element 83. The amplifier 403 functions as a second-stage amplifier.

In the above description of the power amplifier circuits 11 to 20, the transistor elements 51 and 61 respectively correspond to the bias circuits 301 and 302 so that the output level is switched between two levels of the high-power mode and the low-power mode, but this should not be construed in a limiting sense. Three or more bias circuits may be provided so that the output level is switched among three or more levels.

Furthermore, in the above description of the power amplifier circuits 13 to 20, the number m of the unit transistors 101 is two or more, but this should not be construed in a limiting sense. The number m of the unit transistors 101 may be one.

Moreover, in the above description of the power amplifier circuits 13 to 20, the number n of the unit transistors 201 is two or more, but this should not be construed in a limiting sense. The number n of the unit transistors 201 may be one.

Further, in the above description of the power amplifier circuits 11 to 20, the transistors 301a, 301b, and 301c of the bias circuits 301 and 302 are bipolar transistors, but this should not be construed in a limiting sense. The transistors 301a, 301b, and 301c of the bias circuits 301 and 302 may be field effect transistors.

Furthermore, in the description of the power amplifier circuits 11 to 20, the unit transistor 101 includes the capacitor 52, but this should not be construed in a limiting sense. The unit transistor 101 does not necessarily include the capacitor 52. A resistance element or an inductor may be coupled in series with the capacitor 52.

Moreover, in the description of the power amplifier circuits 11 to 20, the unit transistor 201 includes the capacitor 62, but this should not be construed in a limiting sense. The unit transistor 201 does not necessarily include the capacitor 62. A resistance element or an inductor may be coupled in series with the capacitor 62.

The exemplary embodiments of the present disclosure have been described above. The power amplifier circuits 11 to 20 include the transistor element 51, the resistance element 53, the bias circuit 301, the transistor element 61, the resistance element 63, the bias circuit 302, and the impedance circuit 501. The transistor element 51 has the base coupled to the input terminal 31, the collector coupled to the output terminal 32, and the emitter coupled to the ground. The bias circuit 301 is coupled to the base of the transistor element 51 via the resistance element 53. The bias circuit 301 supplies a bias to the transistor element 51. The transistor element 61 has the base coupled to the input terminal 31, the collector coupled to the output terminal 32, and the emitter coupled to the ground. The bias circuit 302 is coupled to the base of the transistor element 61 via the resistance element 63. The bias circuit 302 supplies a bias to the transistor element 61. The impedance circuit 501 has the first end coupled between the base of the transistor element 51 and the input terminal 31 and the second end coupled between the bias circuit 301 and the resistance element 53. The impedance circuit 501 is opened for direct-current components and closed for alternating-current components.

As such, the bias circuits 301 and 302 respectively supply a bias to the transistor elements 51 and 61. As a result, for example, the transistor elements 51 and 61 are caused to provide amplification in the high-power mode, whereas only the transistor element 61 is caused to provide amplification in the low-power mode. Accordingly, the output level of the power amplifier circuits 11 to 20 can be changed between two levels. Because the impedance circuit 501 is provided in parallel with the resistance element 53, the alternating-current component of the bias current Ib1 flowing from the bias circuit 301 to the base of the transistor element 51 can be caused to flow through the impedance circuit 501 to the base of the transistor element 51. As a result, without lowering the resistance of the resistance element 53, this can achieve the same effect for alternating current as lowering the resistance of the resistance element 53, and consequently, it is possible to reduce the gain compression. By reducing the gain compression of the transistor element 51, the linearity of the amplification characteristic can be maintained. Consequently, for example, it is possible to improve the distortion characteristic of the power amplifier circuits 11 to 20 in the high-power mode.

The power amplifier circuits 12 to 20 further include the impedance circuit 601. The impedance circuit 601 has the first end coupled between the input terminal 31 and the base of the transistor element 61 and the second end coupled between the bias circuit 302 and the resistance element 63. The impedance circuit 601 is opened for direct-current components and closed for alternating-current components.

Because the impedance circuit 601 is provided in parallel with the resistance element 63, the alternating-current component of the bias current Ib2 flowing from the bias circuit 302 to the base of the transistor element 61 can be caused to flow through the impedance circuit 601 to the base of the transistor element 61. As a result, without lowering the resistance of the resistance element 63, this can achieve the same effect for alternating current as lowering the resistance of the resistance element 63, and consequently, it is possible to reduce the gain compression of the transistor element 61. By reducing the gain compression of the transistor element 61, the linearity of the amplification characteristic of the transistor element 61 can be maintained. Consequently, for example, it is possible to improve the distortion characteristic of the power amplifier circuits 12 to 20 in the low-power mode.

Because the bias circuits 301 and 302 are separated from each other with respect to direct-current components, the bias circuits 301 and 302 can adequately supply a bias of a direct-current component respectively to the base of the transistor element 51 and the base of the transistor element 61. Because the impedance circuits 501 and 601 are respectively provided in parallel with the resistance elements 53 and 63, the alternating-current component of the bias current Ib1 and the alternating-current component of the bias current Ib2 are caused to respectively flow to the impedance circuits 501 and 601. The transistor elements 51 and 61 can thus provide amplification with balance. Further, because voltage drop across the resistance elements 53 and 63 is reduced, it is possible to suppress the gain compression of the transistor elements 51 and 61 regardless of the operation mode. This means that the distortion characteristic of the power amplifier circuits 11 to 20 can be improved regardless of the operation mode.

The power amplifier circuits 12 to 20 include the number m of the unit transistors 101 each having the resistance element 53 and the transistor element 51 and also include the number n of the unit transistors 201 each having the resistance element 63 and the transistor element 61. The impedance circuit 501 includes the capacitor 501a. The impedance circuit 601 includes the capacitor 601a. When the number m of the unit transistors 101 is greater than the number n of the unit transistors 201, the capacitance of the capacitor 501a is larger than the capacitance of the capacitor 601a; when the number m of the unit transistors 101 is equal to or smaller than the number n of the unit transistors 201, the capacitance of the capacitor 501a is equal to or smaller than the capacitance of the capacitor 601a.

With this configuration, the capacitance of the capacitor 501a corresponds to the number m of the unit transistors 101, and the capacitance of the capacitor 601a corresponds to the number n of the unit transistors 201. As a result, the alternating-current component of the bias current Ib1 and the alternating-current component of the bias current Ib2 can be set to appropriate values, and thus, it is possible to effectively reduce the gain compression of the transistor elements 51 and 61 and also suppress the degradation of the distortion characteristic of the transistor elements 51 and 61.

The power amplifier circuits 12 to 20 include the number m of the unit transistors 101 each having the resistance element 53 and the transistor element 51 and also include the number n of the unit transistors 201 each having the resistance element 63 and the transistor element 61. The impedance circuit 501 includes the capacitor 501a. The impedance circuit 601 includes the capacitor 601a. The ratio of the capacitance of the capacitor 501a to the capacitance of the capacitor 601a is in the range of 0.75 to 1.25 times larger than the ratio of the number m of the unit transistors 101 to the number n of the unit transistors 201.

With this configuration, the capacitance of the capacitor 501a corresponds to the number m of the unit transistors 101, and the capacitance of the capacitor 601a corresponds to the number n of the unit transistors 201. As a result, the alternating-current component of the bias current Ib1 and the alternating-current component of the bias current Ib2 can be individually set to appropriate values, and thus, it is possible to effectively reduce the gain compression of the transistor elements 51 and 61 and also suppress the degradation of the distortion characteristic of the transistor elements 51 and 61.

The power amplifier circuit 16 further includes the matching circuit 701. The matching circuit 701 has the first end coupled to the input terminal 31, the first end of the impedance circuit 501, and the first end of the impedance circuit 601 and the second end coupled to the base of the transistor element 51 and the base of the transistor element 61.

For example, because the impedance circuits 501 and 601 are provided, an impedance mismatch may be caused between a circuit in a stage before the power amplifier circuit 16, and the base of the transistor element 51 and the base of the transistor element 61. With consideration of this problem, the matching circuit 701 is provided between the input terminal 31, the first end of the impedance circuit 501, and the first end of the impedance circuit 601, and the base of the transistor element 51 and the base of the transistor element 61, so that it is possible to improve the impedance mismatch due to the impedance circuits 501 and 601. As a result, while suppressing the degradation of the distortion characteristic of the transistor elements 51 and 61 by using the impedance circuits 501 and 601, it is possible to effectively match the impedance between the circuit in a stage before the power amplifier circuit 16, and the base of the transistor element 51 and the base of the transistor element 61.

In the power amplifier circuit 16, the impedance circuit 501 includes the capacitor 501a. The impedance circuit 601 includes the capacitor 601a. The first capacitance, which is the capacitance of the capacitor 501a, is smaller than the second capacitance, which is the capacitance of the capacitor 501a obtained when the impedance circuit 501 is coupled between the matching circuit 701, and the base of the transistor element 51 and the base of the transistor element 61. The third capacitance, which is the capacitance of the capacitor 601a, is smaller than the fourth capacitance, which is the capacitance of the capacitor 601a obtained when the impedance circuit 601 is coupled between the matching circuit 701, and the base of the transistor element 51 and the base of the transistor element 61.

As such, it is possible to achieve a suitable value of the first capacitance with consideration of, for example, the capacitance of the matching circuit 701, and as a result, the alternating-current component of the bias current Ib1 can be caused to adequately flow to the base of the transistor element 51 through the impedance circuit 501. As a result, it is possible to adequately reduce the gain compression of the transistor element 51 and also suppress the degradation of the distortion characteristic of the transistor element 51. Further, it is possible to achieve a suitable value of the third capacitance with consideration of, for example, the capacitance of the matching circuit 701, and as a result, the alternating-current component of the bias current Ib2 can be caused to adequately flow to the base of the transistor element 61 through the impedance circuit 601. As a result, it is possible to adequately reduce the gain compression of the transistor element 61 and also suppress the degradation of the distortion characteristic of the transistor element 61.

The power amplifier circuit 17 further includes the matching circuit 701. The matching circuit 701 has the first end coupled to the input terminal 31 and the second end coupled to the first end of the impedance circuit 501, the first end of the impedance circuit 601, the base of the transistor element 51, and the base of the transistor element 61.

For example, because the impedance circuits 501 and 601 are provided, an impedance mismatch may be caused between a circuit in a stage before the power amplifier circuit 17, and the base of the transistor element 51 and the base of the transistor element 61. With consideration of this problem, the matching circuit 701 is provided between the input terminal 31, and the first end of the impedance circuit 501, the first end of the impedance circuit 601, and the base of the transistor element 51 and the base of the transistor element 61, so that it is possible to improve the impedance mismatch due to the impedance circuits 501 and 601. As a result, while suppressing the degradation of the distortion characteristic of the transistor elements 51 and 61 by using the impedance circuits 501 and 601, it is possible to effectively match the impedance between the circuit in a stage before the power amplifier circuit 17, and the base of the transistor element 51 and the base of the transistor element 61.

In the power amplifier circuit 17, the impedance circuit 501 includes the capacitor 501a. The impedance circuit 601 includes the capacitor 601a. The second capacitance, which is the capacitance of the capacitor 501a, is larger than the first capacitance, which is the capacitance of the capacitor 501a obtained when the impedance circuit 501 is coupled between the input terminal 31 and the matching circuit 701. The fourth capacitance, which is the capacitance of the capacitor 601a, is larger than the third capacitance, which is the capacitance of the capacitor 601a obtained when the impedance circuit 601 is coupled between the input terminal 31 and the matching circuit 701.

As such, it is possible to achieve a suitable value of the second capacitance with consideration of, for example, the capacitance of the matching circuit 701, and as a result, the alternating-current component of the bias current Ib1 can be caused to adequately flow to the base of the transistor element 51 through the impedance circuit 501. As a result, it is possible to adequately reduce the gain compression of the transistor element 51 and also suppress the degradation of the distortion characteristic of the transistor element 51. Further, it is possible to achieve a suitable value of the fourth capacitance with consideration of, for example, the capacitance of the matching circuit 701, and as a result, the alternating-current component of the bias current Ib2 can be caused to adequately flow to the base of the transistor element 61 through the impedance circuit 601. As a result, it is possible to adequately reduce the gain compression of the transistor element 61 and also suppress the degradation of the distortion characteristic of the transistor element 51.

In the power amplifier circuits 12 to 20, the impedance circuit 501 includes the capacitor 501a.

With this configuration, the capacitor 501a can easily implement the impedance circuit 501 configured to be opened for direct-current components and closed for alternating-current components.

In the power amplifier circuits 12 to 20, the impedance circuit 601 includes the capacitor 601a.

With this configuration, the capacitor 601a can easily implement the impedance circuit 601 configured to be opened for direct-current components and closed for alternating-current components.

In the power amplifier circuit 14, the impedance circuit 501 further includes the resistance element 501b coupled in series with the capacitor 501a.

As described above, because the resistance element 501b is coupled in series with the capacitor 501a in the impedance circuit 501, as for the bias current Ib1, it is possible to control the alternating-current component of the bias current flowing to the resistance element 53 of each of the unit transistors 101 to 10m. As a result, it is possible to more highly accurately reduce the gain compression than the amplifier 401 of the power amplifier circuit 13 (refer to FIG. 8).

In the power amplifier circuit 15, the impedance circuit 501 further includes the inductor 501c coupled in series with the capacitor 501a.

As described above, because the inductor 501c is coupled in series with the capacitor 501a in the impedance circuit 501, as for the bias current Ib1, it is possible to control the alternating-current component of the bias current flowing to the resistance element 53 of each of the unit transistors 101 to 10m. Specifically, for example, by appropriately controlling the resonant frequency of a series resonant circuit constituted by the capacitor 501a and the inductor 501c coupled in series with each other, it is possible to control the alternating-current component of the bias current in response to the frequency of the alternating-current component. As a result, it is possible to more highly accurately reduce the gain compression than the amplifier 401 of the power amplifier circuit 13 (refer to FIG. 8).

In the power amplifier circuit 14, the impedance circuit 601 further includes the resistance element 601b coupled in series with the capacitor 601a.

As described above, because the resistance element 601b is coupled in series with the capacitor 601a in the impedance circuit 601, as for the bias current Ib2, it is possible to control the alternating-current component of the bias current flowing to the resistance element 63 of each of the unit transistors 201 to 20n. As a result, it is possible to more highly accurately reduce the gain compression than the amplifier 402 of the power amplifier circuit 13 (refer to FIG. 8).

In the power amplifier circuit 15, the impedance circuit 601 further includes the inductor 601c coupled in series with the capacitor 601a.

As described above, because the inductor 601c is coupled in series with the capacitor 601a in the impedance circuit 601, as for the bias current Ib2, it is possible to control the alternating-current component of the bias current flowing to the resistance element 63 of each of the unit transistors 201 to 20n. Specifically, for example, by appropriately controlling the resonant frequency of a series resonant circuit constituted by the capacitor 601a and the inductor 601c coupled in series with each other, it is possible to control the alternating-current component of the bias current in response to the frequency of the alternating-current component. As a result, it is possible to more highly accurately reduce the gain compression than the amplifier 402 of the power amplifier circuit 13 (refer to FIG. 8).

In the power amplifier circuits 11 to 20, the first end of the impedance circuit 501 is coupled to the node N11 provided in the wire connecting the input terminal 31 and the base of the transistor element 51. The length L11 of the wire from the input terminal 31 to the node N11 is more than 0.5 times longer than the length L10 of the wire from the input terminal 31 to the base of the transistor element 51.

With this configuration, the alternating-current component of the bias current Ib1 flowing from the bias circuit 301 to the base of the transistor element 51 can be caused to efficiently flow through the impedance circuit 501 to the base of the transistor element 51. As a result, it is possible to effectively reduce the gain compression of the transistor element 51 and also suppress the degradation of the distortion characteristic of the transistor element 51.

In the power amplifier circuits 11 to 20, the first end of the impedance circuit 601 is coupled to the node N21 provided in the wire connecting the input terminal 31 and the base of the transistor element 61. The length L21 of the wire from the input terminal 31 to the node N21 is more than 0.5 times longer than the length of the wire from the input terminal 31 to the base of the transistor element 61.

With this configuration, the alternating-current component of the bias current Ib2 flowing from the bias circuit 302 to the base of the transistor element 61 can be caused to efficiently flow through the impedance circuit 601 to the base of the transistor element 61. As a result, it is possible to effectively reduce the gain compression of the transistor element 61 and also suppress the degradation of the distortion characteristic of the transistor element 61.

The power amplifier circuit 18 includes the transistor element 51, the resistance element 53, the bias circuit 301, the transistor element 61, the resistance element 63, the bias circuit 302, the matching circuit 701 and 702, the transistor element 71, and the impedance circuits 501 and 601. The transistor element 51 has the base, the collector coupled to the output terminal 32, and the emitter coupled to the ground. The bias circuit 301 is coupled to the base of the transistor element 51 via the resistance element 53. The bias circuit 301 supplies a bias to the transistor element 51. The transistor element 61 has the base, the collector coupled to the output terminal 32, and the emitter coupled to the ground. The bias circuit 302 is coupled to the base of the transistor element 61 via the resistance element 63. The bias circuit 302 supplies a bias to the transistor element 61. The transistor element 71 has the base coupled to the input terminal 31 via the matching circuit 702, the collector coupled to the base of the transistor element 51 and the base of the transistor element 61 via the matching circuit 701, and the emitter coupled to the ground. The impedance circuit 501 has the first end coupled between the base of the transistor element 71 and the matching circuit 702 and the second end coupled between the bias circuit 301 and the resistance element 53. The impedance circuit 601 is opened for direct-current components and closed for alternating-current components. The impedance circuit 601 has the first end coupled between the base of the transistor element 71 and the matching circuit 702 and the second end coupled between the bias circuit 302 and the resistance element 63. The impedance circuit 601 is opened for direct-current components and closed for alternating-current components.

As such, the bias circuits 301 and 302 respectively supply a bias to the transistor elements 51 and 61. As a result, for example, the transistor elements 51 and 61 are caused to provide amplification in the high-power mode, whereas only the transistor element 61 is caused to provide amplification in the low-power mode. Accordingly, the output level of the power amplifier circuit 18 can be changed between two levels. Because the impedance circuit 501 is provided in parallel with the resistance element 53, the alternating-current component of the bias current Ib1 flowing from the bias circuit 301 to the base of the transistor element 51 can be caused to flow through the impedance circuit 501, the transistor element 71, and the matching circuit 701 to the base of the transistor element 51. As a result, without lowering the resistance of the resistance element 53, this can achieve the same effect for alternating current as lowering the resistance of the resistance element 53, and consequently, it is possible to reduce the gain compression. By reducing the gain compression of the transistor element 51, the linearity of the amplification characteristic can be maintained. Consequently, for example, it is possible to improve the distortion characteristic of the power amplifier circuit 18 in the high-power mode.

Because the impedance circuit 601 is provided in parallel with the resistance element 63, the alternating-current component of the bias current Ib2 flowing from the bias circuit 302 to the base of the transistor element 61 can be caused to flow through the impedance circuit 601, the transistor element 71, and the matching circuit 701 to the base of the transistor element 61. As a result, without lowering the resistance of the resistance element 63, this can achieve the same effect for alternating current as lowering the resistance of the resistance element 63, and consequently, it is possible to reduce the gain compression of the transistor element 61. By reducing the gain compression of the transistor element 61, the linearity of the amplification characteristic of the transistor element 61 can be maintained. Consequently, for example, it is possible to improve the distortion characteristic of the power amplifier circuit 18 in the low-power mode.

Because the bias circuits 301 and 302 are separated from each other with respect to direct-current components, the bias circuits 301 and 302 can adequately supply a bias of a direct-current component respectively to the base of the transistor element 51 and the base of the transistor element 61. Because the impedance circuits 501 and 601 are respectively provided in parallel with the resistance elements 53 and 63, the alternating-current component of the bias current Ib1 and the alternating-current component of the bias current Ib2 are caused to respectively flow to the impedance circuits 501 and 601. The transistor elements 51 and 61 can thus provide amplification with balance. Further, because voltage drop across the resistance elements 53 and 63 is reduced, it is possible to suppress the gain compression of the transistor elements 51 and 61 regardless of the operation mode. This means that the distortion characteristic of the power amplifier circuits 11 to 20 can be improved regardless of the operation mode.

The impedance circuits 501 and 601 are not coupled between the first-stage transistor element 71 and the final-stage transistor elements 51 and 61, and as a result, it is possible to reduce the likelihood of a mismatch of the input of the final-stage transistor elements 51 and 61. Consequently, in the power amplifier circuit 18 including amplifiers in two stages, it is possible to suppress the degradation of the input-output characteristics of the final-stage transistor elements 51 and 61 due to the impedance circuits 501 and 601.

The embodiments described above have been made for ease of understanding the present disclosure and should not be construed to limit the present disclosure. The present disclosure can be changed or improved without departing from its spirit and also includes equivalents thereof. This means that modifications to the embodiments designed by those skilled in the art as appropriate are also embodied in the scope of the present disclosure when the modifications have features of the present disclosure. For example, the elements included in the embodiments, the arrangements thereof, materials, conditions, shapes, sizes are not limited to the examples and may be changed as appropriate. The embodiments described above are mere examples, and as might be expected, the configurations described in the different embodiments may be partially replaced or combined with each other. These modifications are embraced within the scope of the present disclosure when these modifications contain the attributes of the present disclosure.

What is claimed is:

1. A power amplifier circuit comprising:
   a first transistor having a base coupled to an input terminal, a collector coupled to an output terminal, and an emitter coupled to ground;
   a first resistance element;
   a first bias circuit coupled to the base of the first transistor via the first resistance element, the first bias circuit being configured to supply a bias to the first transistor;
   a second transistor having a base coupled to the input terminal, a collector coupled to the output terminal, and an emitter coupled to ground;
   a second resistance element;
   a second bias circuit coupled to the base of the second transistor via the second resistance element, the second bias circuit being configured to supply a bias to the second transistor; and
   a first impedance circuit having a first end coupled between the base of the first transistor and the input terminal, and a second end coupled between the first bias circuit and the first resistance element, the first impedance circuit being configured to have an open state for a direct-current component of a signal passing through the first impedance circuit, and have a closed state for an alternating-current component of the signal passing through the first impedance circuit,
   wherein the first end of the first impedance circuit is coupled to a first node, the first node being on a first wire connecting the input terminal and the base of the first transistor, and
   wherein a distance of the first wire from the input terminal to the first node is more than 0.5 times a distance of the first wire from the input terminal to the base of the first transistor.

2. The power amplifier circuit according to claim 1, further comprising:
   a second impedance circuit having a first end coupled between the input terminal and the base of the second transistor, and a second end coupled between the second bias circuit and the second resistance element, the second impedance circuit being configured to have an open state for a direct-current component of a signal passing through the second impedance circuit, and to have a closed state for an alternating-current component of the signal passing through the second impedance circuit.

3. The power amplifier circuit according to claim 2, wherein:
   the power amplifier circuit comprises one or more sets of the first resistance element and the first transistor,
   the power amplifier circuit comprises one or more sets of the second resistance element and the second transistor,
   the first impedance circuit comprises a first capacitor,
   the second impedance circuit comprises a second capacitor,
   there are more sets of the first resistance element and the first transistor than sets of the second resistance element and the second transistor, and
   a capacitance of the first capacitor is greater than a capacitance of the second capacitor.

4. The power amplifier circuit according to claim 2, wherein:
   the power amplifier circuit comprises one or more sets of the first resistance element and the first transistor,
   the power amplifier circuit comprises one or more sets of the second resistance element and the second transistor,
   the first impedance circuit comprises a first capacitor,
   the second impedance circuit comprises a second capacitor,
   there are an equal number or fewer sets of the first resistance element and the first transistor than sets of the second resistance element and the second transistor, and
   a capacitance of the first capacitor is equal to or less than a capacitance of the second capacitor.

5. The power amplifier circuit according to claim 2, wherein:
   the power amplifier circuit comprises one or more sets of the first resistance element and the first transistor,
   the power amplifier circuit comprises one or more second sets of the second resistance element and the second transistor,
   the first impedance circuit comprises a first capacitor,
   the second impedance circuit comprises a second capacitor, and
   a ratio of a capacitance of the first capacitor to a capacitance of the second capacitor is between 0.75 and 1.25 times larger than a ratio of a number of sets of the first resistance element and the first transistor to a number of sets of the second resistance element and the second transistor.

6. The power amplifier circuit according to claim 2, further comprising:
   a first matching circuit having a first end coupled to the input terminal, the first end of the first impedance circuit, and the first end of the second impedance circuit, and having a second end coupled to the base of the first transistor and the base of the second transistor.

7. The power amplifier circuit according to claim 6, wherein:
   the first impedance circuit comprises a first capacitor,
   the second impedance circuit comprises a second capacitor, and a first capacitance of the first capacitor is less than a second capacitance of the first capacitor, the second capacitance being obtained when the first impedance circuit is coupled between the first matching circuit, and the base of the first transistor and the base of the second transistor, and a third capacitance of the second capacitor is less than a fourth capacitance of the second capacitor, the fourth capacitance being obtained when the second impedance circuit is coupled between the first matching circuit, and the base of the first transistor and the base of the second transistor.

8. The power amplifier circuit according to claim 2, further comprising:
a first matching circuit having a first end coupled to the input terminal and a second end coupled to the first end of the first impedance circuit, the first end of the second impedance circuit, the base of the first transistor, and the base of the second transistor.

9. The power amplifier circuit according to claim 8, wherein:
the first impedance circuit comprises a first capacitor, the second impedance circuit comprises a second capacitor, and
a second capacitance of the first capacitor is greater than a first capacitance of the first capacitor, the first capacitance being obtained when the first impedance circuit is coupled between the input terminal and the first matching circuit, and
a fourth capacitance of the second capacitor is greater than a third capacitance of the second capacitor, the third capacitance being obtained when the second impedance circuit is coupled between the input terminal and the first matching circuit.

10. The power amplifier circuit according to claim 1, wherein the first impedance circuit comprises a first capacitor.

11. The power amplifier circuit according to claim 2, wherein the second impedance circuit comprises a second capacitor.

12. The power amplifier circuit according to claim 10, wherein the first impedance circuit further comprises a third resistance element coupled in series with the first capacitor.

13. The power amplifier circuit according to claim 10, wherein the first impedance circuit further comprises a first inductor coupled in series with the first capacitor.

14. The power amplifier circuit according to claim 11, wherein the second impedance circuit further comprises a fourth resistance element coupled in series with the second capacitor.

15. The power amplifier circuit according to claim 11, wherein the second impedance circuit further comprises a second inductor coupled in series with the second capacitor.

16. The power amplifier circuit according to claim 2, wherein:
the first end of the second impedance circuit is coupled to a second node, the second node being on a second wire connecting the input terminal and the base of the second transistor, and
a distance of the second wire from the input terminal to the second node is more than 0.5 times a distance of the second wire from the input terminal to the base of the second transistor.

17. A power amplifier circuit comprising:
a first transistor having a base, a collector coupled to an output terminal, and an emitter coupled to ground;
a first resistance element;
a first bias circuit coupled to the base of the first transistor via the first resistance element, the first bias circuit being configured to supply a bias to the first transistor;
a second transistor having a base, a collector coupled to the output terminal, and an emitter coupled to ground;
a second resistance element;
a second bias circuit coupled to the base of the second transistor via the second resistance element, the second bias circuit being configured to supply a bias to the second transistor;
a first matching circuit;
a second matching circuit;
a third transistor having a base coupled to an input terminal via the second matching circuit, a collector coupled to the base of the first transistor and the base of the second transistor via the first matching circuit, and an emitter coupled to ground;
a first impedance circuit having a first end coupled between the base of the third transistor and the second matching circuit, and a second end coupled between the first bias circuit and the first resistance element, the first impedance circuit being configured to have an open state for a direct-current component of a signal passing through the first impedance circuit, and to have a closed state for an alternating-current component of the signal passing through the first impedance circuit; and
a second impedance circuit having a first end coupled between the base of the third transistor and the second matching circuit, and a second end coupled between the second bias circuit and the second resistance element, the second impedance circuit being configured to have an open state for a direct-current component of a signal passing through the second impedance circuit, and to have a closed state for an alternating-current component of the signal passing through the second impedance circuit.

18. The power amplifier circuit according to claim 1, wherein the first impedance circuit is connected between the first bias circuit and the input terminal.

* * * * *